United States Patent
Shionoiri

(10) Patent No.: US 8,614,910 B2
(45) Date of Patent: Dec. 24, 2013

(54) SEMICONDUCTOR DEVICE AND METHOD FOR DRIVING THE SAME

(75) Inventor: Yutaka Shionoiri, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 160 days.

(21) Appl. No.: 13/186,879

(22) Filed: Jul. 20, 2011

(65) Prior Publication Data
US 2012/0026774 A1    Feb. 2, 2012

(30) Foreign Application Priority Data
Jul. 29, 2010    (JP) ................. 2010-170306

(51) Int. Cl.
- G11C 5/06 (2006.01)
- G11C 5/10 (2006.01)
- G11C 8/08 (2006.01)
- G11C 11/24 (2006.01)
- G11C 11/36 (2006.01)
- G11C 11/40 (2006.01)
- G11C 11/401 (2006.01)

(52) U.S. Cl.
USPC ........ 365/72; 365/175; 365/230.06; 365/243; 365/63; 365/149

(58) Field of Classification Search
USPC ........ 365/175, 230.06, 243, 63, 72, 149, 187, 365/188
See application file for complete search history.

(56) References Cited

U.S. PATENT DOCUMENTS

| | | |
|---|---|---|
| 4,466,081 A | 8/1984 | Masuoka |
| 5,349,366 A | 9/1994 | Yamazaki et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Ishii.T et al., "A Poly-Silicon TFT With a Sub-5-nm Thick Channel for Low-Power Gain Cell Memory in Mobile Applications,", IEEE Transactions on Electron Devices, Nov. 1, 2004, vol. 51, No. 11, pp. 1805-1810.

(Continued)

*Primary Examiner* — J. H. Hur
(74) *Attorney, Agent, or Firm* — Eric J. Robinson; Robinson Intellectual Property Law Office, P.C.

(57) ABSTRACT

An object is to provide a semiconductor device in which lower power consumption is realized by lowering voltage for data writing without increase in types of power supply potentials. Another object is to provide a semiconductor device in which threshold voltage drop of a selection transistor is suppressed without increase in types of power supply potentials for data writing. A diode-connected transistor is electrically connected in series with a word line electrically connected to a gate of an n-channel selection transistor. A capacitor is provided between the word line and a bit line electrically connected to one of a source and a drain of the selection transistor; alternatively, the capacitance between the bit line and the word line is used. In data writing, the timing of selecting the word line is earlier than the timing of selecting the bit line.

20 Claims, 11 Drawing Sheets

(56) References Cited

U.S. PATENT DOCUMENTS

| | | | |
|---|---|---|---|
| 5,446,344 A | 8/1995 | Kanazawa | |
| 5,731,856 A | 3/1998 | Kim et al. | |
| 5,744,864 A | 4/1998 | Cillessen et al. | |
| 6,127,702 A | 10/2000 | Yamazaki et al. | |
| 6,294,274 B1 | 9/2001 | Kawazoe et al. | |
| 6,563,174 B2 | 5/2003 | Kawasaki et al. | |
| 6,646,949 B1* | 11/2003 | Ellis et al. | 365/230.06 |
| 6,727,522 B1 | 4/2004 | Kawasaki et al. | |
| 6,788,108 B2 | 9/2004 | Miyake et al. | |
| 6,928,136 B2 | 8/2005 | Nagao et al. | |
| 6,958,750 B2 | 10/2005 | Azami et al. | |
| 6,975,142 B2 | 12/2005 | Azami et al. | |
| 7,049,190 B2 | 5/2006 | Takeda et al. | |
| 7,057,598 B2 | 6/2006 | Azami et al. | |
| 7,061,014 B2 | 6/2006 | Hosono et al. | |
| 7,064,346 B2 | 6/2006 | Kawasaki et al. | |
| 7,068,076 B2 | 6/2006 | Azami et al. | |
| 7,105,868 B2 | 9/2006 | Nause et al. | |
| 7,202,863 B2 | 4/2007 | Kimura et al. | |
| 7,211,825 B2 | 5/2007 | Shih et al | |
| 7,218,349 B2 | 5/2007 | Kimura | |
| 7,259,429 B2 | 8/2007 | Yamazaki | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0021788 A1* | 2/2004 | Shizukuishi | 348/311 |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0073871 A1* | 4/2005 | Luk et al. | 365/149 |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0008805 A1* | 1/2007 | Jung et al. | 365/230.06 |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1* | 5/2007 | Akimoto | 257/61 |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0002590 A1 | 1/2009 | Kimura | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065839 A1 | 3/2010 | Yamazaki et al. | |
| 2010/0065840 A1 | 3/2010 | Yamazaki et al. | |
| 2010/0065844 A1 | 3/2010 | Tokunaga | |
| 2010/0072470 A1 | 3/2010 | Yamazaki et al. | |
| 2010/0072471 A1 | 3/2010 | Yamazaki et al. | |
| 2010/0092800 A1 | 4/2010 | Itagaki et al. | |
| 2010/0097838 A1 | 4/2010 | Tanaka et al. | |
| 2010/0109002 A1 | 5/2010 | Itagaki et al. | |
| 2010/0148171 A1 | 6/2010 | Hayashi et al. | |
| 2010/0193785 A1 | 8/2010 | Kimura | |

FOREIGN PATENT DOCUMENTS

| | | |
|---|---|---|
| JP | 57-105889 | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Kim.W et al., "An Experimental High-Density DRAM Cell with a Built-in Gain Stage,", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs ,", IEDM 92: Technical Digest of International Electron Devices Meeting, Dec. 13, 1992, pp. 1006-1008.

(56) References Cited

OTHER PUBLICATIONS

Shukuri.S et al., "A Semi-Static Complementary Gain Cell Technology for Sub-1 V Supply DRAM's,", IEEE Transactions on Electron Devices, Jun. 1, 1994, vol. 41, No. 6, pp. 926-931.
Fortunato.E et al., "Wide-Bandgap High-Mobility Zno Thin-Film Transistors Produced at Room Temperature,", Appl. Phys. Lett. (Applied Physics Letters), Sep. 27, 2004, vol. 85, No. 13, pp. 2541-2543.
Dembo.H et al., "RFCPUC on Glass and Plastic Substrates Fabricated by TFT Transfer Technology,", IEDM 05: Technical Digest of International Electron Devices Meeting, Dec. 5, 2004, pp. 1067-1069.
Ikeda.T et al., "Full-Functional System Liquid Crystal Display Using CG-Silicon Technology,", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors,", Nature, Nov. 25, 2004, vol. 432, pp. 488-492.
Park.J et al., "Improvements in the Device Characteristics of Amorphous Indium Gallium Xinc Oxide Thin-Film Transistors By Ar Plasma Treatment,", Appl. Phys. Lett. (Applied Physics Letters), Jun. 26, 2007, vol. 90, No. 26, pp. 262106-1-262106-3.
Takahashi.M et al., "Theoretical Analysis of Igzo Transparent Amorphous Oxide Semiconductor,", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.
Prins.M et al., "A Ferroelectric Transparent Thin-Film Transistor,", Appl. Phys. Lett. (Applied Physics Letters), Jun. 17, 1996, vol. 68, No. 25, pp. 3650-3652.
Nakamura.M et al., "The phase relations in the In2O3—Ga2ZnO4—ZnO system at 1350° C,", Journal of Solid State Chemistry, Aug. 1, 1991, vol. 93, No. 2, pp. 298-315.
Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O—ZnO System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.
Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.
Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium DIgest of Technical Papers, May 20, 2008, vol. 39, pp. 633-636.
Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SIG Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs ,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits , 2008, vol. 43, No. 1, pp. 292-299.
Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transistion:The "Blue Phase", ", Physics Letters, Sep. 10, 1973, vol. 45A, No. 2, pp. 115-116.
Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED DIsplay on Plastic Film and its Bending Properties,", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—ZN—Oxide TFTS,", IDW '09 : Proceedings of the 16th International Display Workshops, 2009, pp. 689-692.
Park.J et al., "Amorphous Indium—Gallium—Zinc Oxide TFTS and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by Peald Grown ZNO TFT,", IMID '07 Digest, 2007, pp. 1249-1252.
Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.
Osada.T et al., "Development of Driver-Integrated Panel Using Amorphous In—Ga—Zn-Oxide TFT,", AM-FPD '09 Digest of Technical Papers, Jul. 1, 2009, pp. 33-36.
Hirao.T et al., "Novel Top-Gate Zinc Oxide Thin-Film Transistors (ZNO TFTs) for AMLCDS,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—ZN-Oxide TFT,", SID

(56) References Cited

OTHER PUBLICATIONS

Digest '09 : SID International Symposium Digest of Technical Papers, May 31, 2009, pp. 1110-1112.
Ohara.H et al., "21.3:4.0 In. QVGA AMOLED Display Using In—Ga—Zn-Oxide TFTs With a Novel Passivation Layer,", SID Digest '09 : SID International Symposium Digest of Technical Paper, May 31, 2009, pp. 284-287.
Miyasaka.M, "SUFTLA Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions of Electron Devices, Jul. 1, 1995, vol. 23, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.
Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.
Lee.H et al., "Current Status of, Challenges to, and Perspective View of AM-OLED ,", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.
Nakamura.M, "Synthesis of Homologous Compound with New Long-Period Structure,", NIRIM Newsletter, Mar. 1, 1995, vol. 150, pp. 1-4.
Kikuchi.H et al., "Polymer-Stabilized Liquid Crystal Blue Phases,", Nature Materials, Sep. 2, 2002, vol. 1, pp. 64-68.
Kimizuka.N et al., "Spinel,YBFE2O4, and YB2FE3O7 Types of Structures for Compounds in the In2O3 and SC2O3-A2O3-BO Systems [A; Fe, Ga, or Al; B: Mg, Mn, Fe, Ni, Cu,or ZN] at Temperature Over 1000° C,", Journal of Solid State Chemistry, 1985, vol. 60, pp. 382-384.
Kitzerow.H et al., "Observation of Blue Phases in Chiral Networks,", Liquid Crystals, 1993, vol. 14, No. 3, pp. 911-916.
Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.
Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display,", SID DIgest '08 : SID International Symposium Digest of Technical Papers, May 20, 2008, vol. 39, pp. 629-632.
Orita.M et al., "Mechanism of Electrical Conductivity of Transparent InGaZnO4,", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.
Janotti.A et al., "Native Point Defects in ZnO,", Phys. Rev. B (Physical Review. B), Oct. 4, 2007, vol. 76, NO. 16, pp. 165202-1-165202-22.
Park.J et al.,."Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.
Janotti.A et al., "Oxygen Vacancies in ZnO,", Appl. Phys. Lett. (Applied Physics Letters) , 2005, vol. 87, pp. 122102-1-122102-3.
Oba.F et al., "Defect energetics in ZnO: A hybrid Hartree-Fock density functional study,", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor,", Philosophical Magazine, 2001, vol. 81, No. 5, pp. 501-515.
Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays,", IDW '08 : Proceedings of the 6th International Display Workshops, Dec. 3, 2008, pp. 581-584.
Kim.S et al., "High-Performance oxide thin film transistors passivated by various gas plasmas,", 214th ECS Meeting, 2008, No. 2317, ECS.
Clark.S et al., "First Principles Methods Using Castep,", Zeitschrift fur Kristallographie, 2005, vol. 220, pp. 567-570.
Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.
Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

* cited by examiner

SEMICONDUCTOR DEVICE AND METHOD FOR DRIVING THE SAME

BACKGROUND OF THE INVENTION

1. Field of the Invention

The present invention relates to a semiconductor device including a plurality of circuit elements arranged in matrix.

2. Description of the Related Art

There is known a technique for driving a plurality of circuit elements that are arranged in matrix and includes a selection transistor with a plurality of signal lines and a driver circuit. Such a technique is applied, for example, to image display devices such as liquid crystal display devices, light-emitting display devices, and electronic paper and storage devices such as DRAM and SRAM.

An n-channel transistor is often used as the selection transistor. Some of the reasons are as follows: an n-channel transistor operates at high speed because electrons with high mobility are used as carriers, and is suitable for miniaturization because large current can flow through even a relatively small n-channel transistor.

Application of such a technique to image display devices is generally referred to as an active matrix technology or the like. For example, most of active-matrix liquid crystal display devices include a pixel portion including n-channel transistors.

Storage devices using semiconductor elements are broadly classified into two categories: a volatile storage device that loses stored data when power supply stops, and a non-volatile storage device that holds stored data even when power supply stops.

A typical example of a non-volatile storage device is flash memory. Flash memory holds electric charge in a floating gate and thus has a semi-permanent data retention time (e.g., see Patent Document 1). However, flash memory consumes large power because it requires high voltage for writing and erasing data, and in addition, it is not easy to increase the speed of these operations.

Typical examples of volatile storage devices are dynamic random access memory (DRAM) and static random access memory (SRAM). Such volatile storage devices lose stored data when power supply stops, but consume relatively less power because they do not need high voltage as in non-volatile memory.

In recent years, development of devices for which low power consumption is required, for example, portable electronic devices such as mobile phones and small computer and wireless devices to which power is wirelessly supplied, such as non-contact IC cards and RFID tags, has progressed. In such devices, even a slight increase in power consumption sometimes becomes problematic. The increase in power consumption leads to a reduction in the communication range in RFID tags, and leads to a reduction in the driving time with a battery in portable phones, for example.

REFERENCE

Patent Document 1: Japanese Published Patent Application No. S57-105889

SUMMARY OF THE INVENTION

It is expected that image display devices such as liquid crystal display devices and light-emitting display devices and storage devices such as volatile memory (e.g., DRAM and SRAM) can be driven with lower power consumption; therefore, a further reduction in power consumption has been studied.

Because of the above reason, an n-channel transistor is often used as a selection transistor in circuits included in these devices. However, threshold voltage drop of the transistor is caused when data is written into a pixel or a memory element through the n-channel selection transistor. In other words, a potential applied through the transistor is lowered by the value of the threshold voltage of the transistor, so that the loss of the potential to be written is caused accordingly.

In order to solve that problem, it is necessary to take measures for data writing, such as using a potential that has been increased by the value of the threshold voltage of a transistor in advance, or applying a high potential to a gate of the selection transistor by using two different power supplies electrically connected to the gate and a drain of the selection transistor. However, these measures result in the increase in write voltage, which leads to the increase in power consumption.

In devices such as portable devices and wireless devices that are adversely affected by a slight increase in power consumption and thus require low power consumption, the above measures using a high power supply potential for a write operation are not preferable because they lead to the increase in power consumption of the devices. In addition, the measures with an additional power supply circuit for generating a power supply potential cause the increase in power consumption of the devices because of power consumed by the power supply circuit.

Therefore, major challenges of reducing power consumption of the above devices are to realize a write operation without increasing the number of power supply circuits, and to eliminate the loss of a write voltage due to threshold voltage drop of a selection transistor in data writing so that a write operation is performed at lower voltage than in conventional devices.

In view of the foregoing problems, an object of the present invention is to provide a semiconductor device in which lower power consumption is realized by lowering voltage for data writing without increase in types of power supply potentials. Another object is to provide a semiconductor device in which threshold voltage drop of a selection transistor is suppressed without increase in types of power supply potentials for data writing.

In order to solve the problem, according to one embodiment of the present invention, a plurality of word lines (also referred to as first signal lines) and a plurality of bit lines (also referred to as second signal lines) that intersect the word lines are provided. In a matrix circuit including a circuit element including a selection transistor at the intersection of the word line and the bit line, a diode-connected transistor is electrically connected in series with the word line electrically connected to a gate of the n-channel selection transistor. A capacitance is provided between the word line and the bit line electrically connected to one of a source and a drain of the selection transistor. In data writing, the timing of selecting the word line is earlier than the timing of selecting the bit line.

Note that the circuit element includes the selection transistor having the one of the source and the drain electrically connected to the bit line, and a functional circuit electrically connected to the other of the source and the drain of the selection transistor. The functional circuit realizes various functions in accordance with a potential input from the bit line through the selection transistor. For example, in DRAM, a capacitor corresponds to the functional circuit. Further, in a light-emitting device, a circuit which includes a light-emitting element, a storage capacitor and a current control transistor and the like corresponds to the functional circuit.

With the above structure, in data writing, the word line that is selected earlier is brought into a floating state by a power supply voltage while having a high potential. After that, when the same power supply voltage is applied to the bit line, the potential of the word line is raised by capacitive coupling due to the capacitance between the word line and the bit line, and becomes higher than the potential of the bit line. Thus, the voltage higher than that of the source is applied to the gate of the selection transistor, so that threshold voltage drop can be suppressed and data can be written with a voltage close to the power supply voltage.

In addition, a transistor connected in series with the word line and a reference potential line to which a reference potential is applied is provided. In order to finish the write operation, the transistor is turned on after or at the same time as the word line is brought into a non-selection state, so that the selection transistor is turned off because the potential of the word line becomes the reference potential. Then, the bit line is brought into a non-selection state, and data writing is finished. Here, a potential that is at least low enough to turn off the transistor when the potential is input to a gate of the transistor is used as the reference potential. Alternatively, a ground potential may be used as the reference potential.

With the above structure, data can be written at low voltage without using a voltage that is increased by the value of the threshold voltage for data writing as in a conventional structure. Thus, power consumption can be reduced.

Even in the case where the threshold voltage of the selection transistor is changed or a plurality of selection transistors in a circuit have variations in threshold voltage, by employing the above-described structure and applying sufficiently high voltage to a gate of the selection transistor, the same voltage can be written through the selection transistor regardless of such change or variation in threshold voltage.

That is, one embodiment of the present invention is a semiconductor device that includes a diode; a first signal line electrically connected to an output terminal of the diode and supplied with a selection signal through the diode; a first transistor having one of a source and a drain electrically connected to the first signal line, and the other of the source and the drain electrically connected to a reference potential line; and a cell array including a second n-channel transistor that has a gate electrically connected to the first signal line and a source and a drain one of which is electrically connected to a second signal line, and is controlled by the selection signal, a capacitance between the first signal line and the second signal line, and a functional circuit electrically connected to the other of the source and the drain of the second transistor and supplied with a signal from the second signal line through the second transistor.

In the semiconductor device according to one embodiment of the present invention, the diode may be a third transistor having a gate electrically connected to one of a source and a drain, and the other of the source and the drain electrically connected to the first signal line.

One embodiment of the present invention is a method for driving a semiconductor device includes a first step of applying a first potential to an input terminal of a diode to increase a potential of a first signal line electrically connected to an output terminal of the diode to a second potential; a second step of applying the first potential to a second signal line and charging a capacitance electrically connected between the first signal line and the second signal line to increase a potential of the first signal line to a third potential, applying the third potential to a gate of a second transistor electrically connected to the first signal line to turn on the second transistor, and applying the first potential to a drain of the second transistor electrically connected to the second signal line; a third step of applying a fourth potential for turning off the second transistor to the diode; and a fourth step of applying the first potential to a gate of a first transistor having a drain electrically connected to the first signal line and a source electrically connected to a reference potential line to turn on the first transistor and decreasing the potential of the first signal line to the fourth potential to apply the fourth potential to the gate of the second transistor and turn off the second transistor. The first potential is higher than the sum of a threshold voltage of the diode and a threshold voltage of the second transistor.

In the method for driving a semiconductor device according to one embodiment of the present invention, a fifth step of applying the fourth potential to the second signal line may be performed after the fourth step.

With the above semiconductor device and driving method, when data is written into a pixel in display devices such as liquid crystal display devices, light-emitting display devices, and electronic paper and a functional element such as a storage element in DRAM, SRAM, and storage devices including an oxide semiconductor by applying voltage to the first signal line (also referred to as the word line) and then to the second signal line (also referred to as the bit line), the potential of the word line is increased to a potential higher than that of the bit line because of capacitive coupling due to the capacitance electrically connected to these lines. Thus, the potential of the gate of the second transistor (also referred to as the selection transistor) becomes higher than that of the drain, so that threshold voltage drop of the second transistor can be suppressed. Then, after the voltage is applied to the word line, the first transistor is turned on so that the potential of the word line is lowered to the ground potential, and the write operation is finished. With such a structure, the write operation can be therefore performed at low power without increasing the number of power supply circuits and using a power supply potential that is set high enough to compensate threshold voltage drop.

In the above semiconductor device and driving method, the potential of the word line is lowered by the value of the threshold voltage of the diode; the adverse effect of threshold voltage drop of the diode can be suppressed by setting a power supply potential higher than the sum of the threshold voltages of the diode and the second transistor. In other words, by using such a potential as the power supply potential, the word line electrically connected to the gate of the selection transistor has a potential high enough to operate the selection transistor in a linear region, so that the adverse effect of threshold voltage drop between the source and the drain can be suppressed. Such an effect is useful in both the case where two potentials of a high-level potential and a low-level potential are applied to a node to which data is to be written (e.g., DRAM, SRAM, and storage devices including an oxide semiconductor transistor that use binary data, and display devices such as liquid crystal display devices and light-emitting display devices employing digital grayscale display) and the case where three or more potentials are applied (e.g., storage devices using ternary or more complex data, and display devices such as liquid crystal display devices and light-emitting display devices employing analog grayscale display).

In the semiconductor device with the above structure and the driving method, the potential input to the input terminal of the diode at the time of writing a given potential to the node can be a potential higher than the sum of the threshold voltages of the diode and the second transistor (selection transistor), which is equal to the potential of the signal input to the bit line. In other words, the potential of the word line can be kept at a potential high enough to operate the selection transistor in a linear region all the time regardless of the value of the potential input to the bit line, so that a given potential of the signal input to the bit line can be written into the node without adverse effect of threshold voltage drop of the selection transistor. Unlike a conventional structure, such a structure does not need different power supply potentials input to the word lines and the bit lines; therefore, the circuit configuration can be simplified and power consumption of a power supply circuit can be reduced.

As the diode, a transistor whose gate and one of a source and a drain are connected to each other can be used. The use of a transistor connected as the diode in this way is effective in simplifying the process because the transistor can be formed through the same process as transistors used in another circuit.

In the semiconductor device according to one embodiment of the present invention, in the second transistor, a semiconductor layer in which a channel is formed may include an oxide semiconductor.

In the semiconductor device according to one embodiment of the present invention, in the second transistor, the current in an off state per 1 μm of channel width may be 100 zA or lower with a source-drain voltage of 3.5 V at a temperature of 25° C.

As the selection transistor, a transistor with an extremely low leakage current in the off state is used. Specifically, a transistor in which an oxide semiconductor is used for a semiconductor layer is used as the selection transistor. For example, it is possible to use a transistor whose leakage current in the off state (off-state current) between a source and a drain per 1 μm of channel width is 100 zA ($1 \times 10^{-19}$ A) or lower with a source-drain voltage of 3.5 V at an operating temperature (e.g., at 25° C.). Since the leakage current of the transistor in which an oxide semiconductor is used for a semiconductor layer is extremely low, the loss of written data due to off leakage current of the selection transistor can be suppressed. In other words, data can be retained for a long time even when data is written with low voltage. That is, a write operation can be performed with low voltage, so that a semiconductor device with lower power consumption can be realized.

For example, in a storage device including a transistor in which an oxide semiconductor is used for a semiconductor layer as a selection transistor, data can be retained by control of the on/off operation of the transistor. Thus, the write operation can be performed with low voltage at which the transistor is turned on. A conventional floating-gate storage device requires a voltage of about 15 V to 20 V for data writing. For example, when the voltage at which the transistor is turned on is 1.7 V, the storage device consumes power reduced mathematically by about 98% from that of a floating-gate storage device driven at 16 V at the time of data writing.

DEFINITION

Note that in this specification and the like, threshold voltage drop is a phenomenon in which, when the same voltage ($V_{dd}$) is applied to a gate and a drain of an n-channel transistor, a voltage input to a source is lowered by the value of the threshold voltage ($V_{th}$) of the transistor.

According to the present invention, it is possible to provide a semiconductor device in which lower power consumption is realized by lowering voltage for data writing without increase in types of power supply potentials. Further, it is possible to provide a semiconductor device in which threshold voltage drop of a selection transistor is suppressed without increase in types of power supply potentials for data writing.

DETAILED DESCRIPTION OF THE INVENTION

Figure 1:
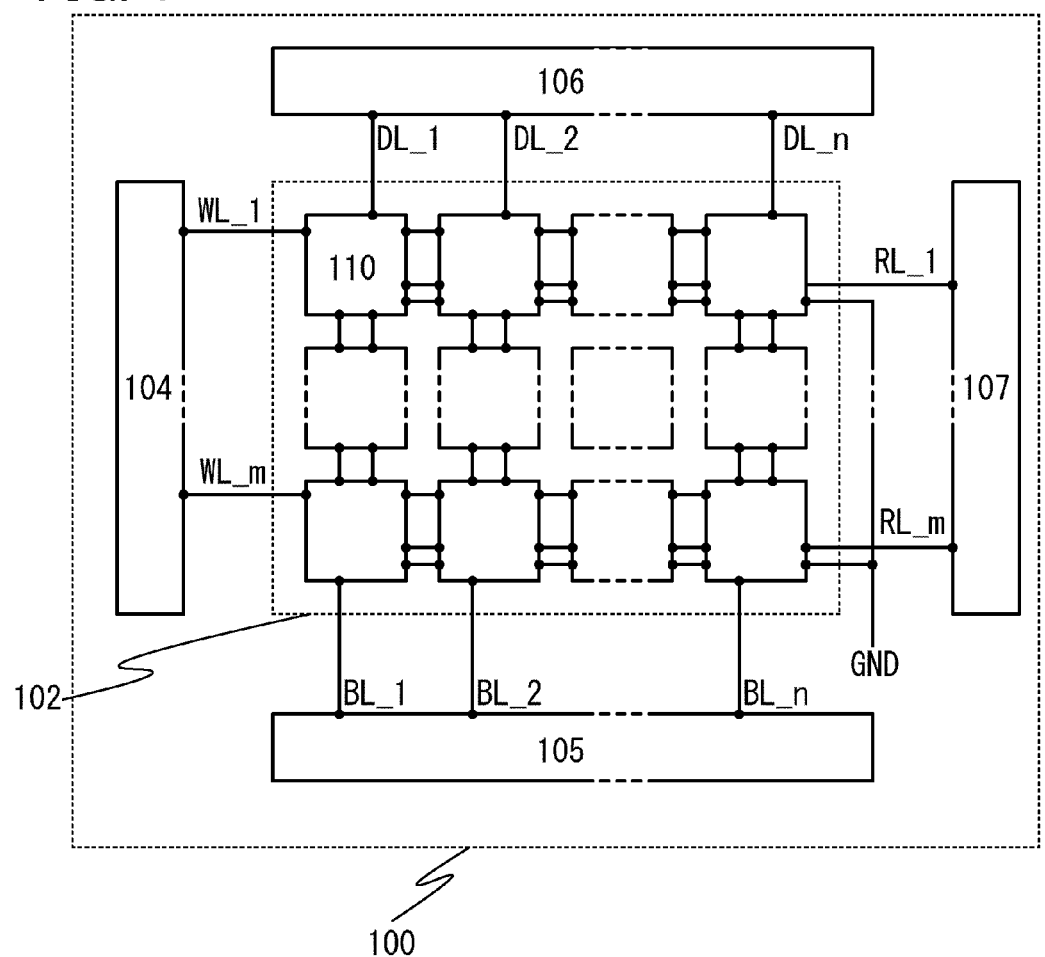
FIG. 1 illustrates a storage device according to one embodiment of the present invention.

Embodiments will be described below with reference to the accompanying drawings. Note that the present invention is not limited to the description below, and it is easily understood by those skilled in the art that modes and details can be changed in various ways without departing from the spirit and scope of the present invention. Therefore, the present invention should not be construed as being limited to the following description of the embodiments. Note that in the structures of the invention described below, the same portions or portions having similar functions are denoted by the same reference numerals in different drawings, and description of such portions is not repeated.

Note that the position, size, range, and the like of each component illustrated in drawings and the like used in this specification are exaggerated for easy understanding and do not represent actual ones in some cases. Therefore, the disclosed invention is not necessarily limited to the position, size, range, and the like disclosed in the drawings and the like.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification.

In this specification and the like, one of a source and a drain of a transistor is called a "first electrode", and the other of the source and the drain is called a "second electrode". Note that a gate is referred to as a "gate" or a "gate electrode".

In addition, in this specification and the like, as for two electrodes of a diode, the electrode on the input side (anode side) with respect to the direction of current flow is called a "first electrode" or an "input terminal", and the electrode on the output side (cathode side) is called a "second electrode" or an "output terminal".

Further, in this specification and the like, the term "electrically connected" includes the case where components are connected through an object having any electric function. There is no particular limitation on an object having any electric function as long as electric signals can be transmitted and received between components that are connected through the object. Examples of the object having any electric function are a switching element such as a transistor, a resistor, an inductor, a capacitor, and an element with a variety of functions as well as an electrode and a wiring.

Embodiment 1

In this embodiment, a structure of a storage device according to one embodiment of the present invention will be described with reference to FIG. 1, FIG. 2, FIG. 3, FIG. 4, and FIGS. 5A and 5B. This embodiment explains a storage device in which an n-channel transistor including a semiconductor layer containing an oxide semiconductor is used as a selection transistor.

<Device Structure>

FIG. 1 is a block diagram of a storage device exemplified in this embodiment.

A storage device 100 includes a memory cell array 102 and peripheral circuits such as a driver circuit 104, a driver circuit 105, a driver circuit 106, and a driver circuit 107.

In the memory cell array 102, memory cells 110 are arranged in a matrix of m rows and n columns (m and n are each a natural number). A word line WL, a bit line BL, a data line DL, a read signal line RL, and a reference potential line are electrically connected to one memory cell.

The driver circuit 104 is electrically connected to m word lines (WL_1 to WL_m). The driver circuit 107 is electrically connected to m read signal lines (RL_1 to RL_m). The driver circuit 105 is electrically connected to n bit lines (BL_1 to BL_n). The driver circuit 106 is electrically connected to n data lines (DL_1 to DL_n).

The driver circuits 104, 105, and 107 can selectively perform a read operation and a write operation on the memory cells 110 by selectively applying a voltage to signal lines electrically connected to the driver circuits.

The driver circuit 106 serves as a read circuit for obtaining data written into the memory cell 110.

Note that the driver circuits 104, 105, 106, and 107 are separately provided here; alternatively, a decoder having a plurality of functions may be used instead of these driver circuits.

Figure 2:
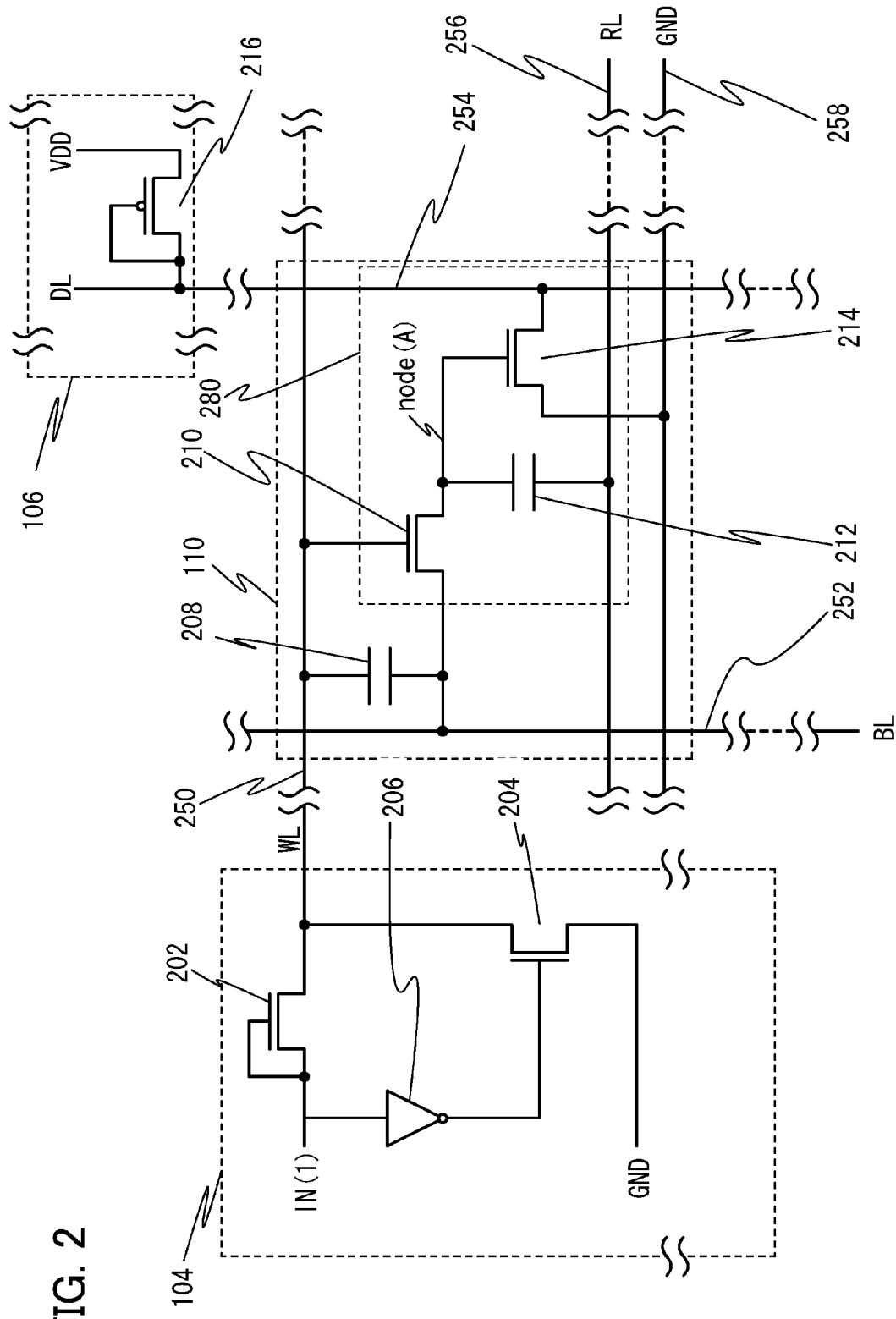
FIG. 2 illustrates a configuration of a storage device according to one embodiment of the present invention.

Next, a configuration of the memory cell 110 and part of a configuration of the driver circuit 104 to which the word line WL is electrically connected will be described with reference to FIG. 2. FIG. 2 is a circuit diagram of one memory cell 110 in the memory cell array 102 and part of the driver circuits 104 and 106 electrically connected to the memory cell 110.

The driver circuit 104 includes an input portion IN(1) and a ground potential input portion GND. The driver circuit 104 also includes a transistor 202, a transistor 204, and an inverter 206. A gate and one of a source and a drain (a first electrode) of the transistor 202 are electrically connected to the input portion IN(1). The other of the source and the drain (a second electrode) of the transistor 202 is electrically connected to a word line 250. A first electrode of the transistor 204 is electrically connected to the word line 250. A second electrode of the transistor 204 is electrically connected to the ground potential input portion GND. An input side of the inverter 206 is electrically connected to the input portion IN(1). An output side of the inverter 206 is electrically connected to a gate of the transistor 204. In this embodiment, a structure in which the ground potential input portion which is applied with the ground potential is provided; however, a structure in which a reference potential that is at least low enough to turn off the transistor connected to the word line 250 is applied may be employed.

The driver circuit 106 electrically connected to a data line 254 includes a power input portion VDD and a transistor 216. A gate and a first electrode of the transistor 216 are electrically connected to the data line 254. A second electrode of the transistor 216 is electrically connected to the power input portion VDD. A power supply potential $V_{dd}$ is always input to the power input portion VDD. A p-channel transistor is used as the transistor 216.

The memory cell 110 is placed in a region surrounded by the word line 250, a bit line 252, the data line 254, a read signal line 256, and a reference potential line 258 and includes a capacitor 208 and a memory portion 280. The reference potential for reading is input to the reference potential line 258. In this structure, a ground potential is used as the reference potential.

One electrode of the capacitor 208 is electrically connected to the word line 250. The other electrode of the capacitor 208 is electrically connected to the bit line 252.

The memory portion 280 includes a transistor 210, a capacitor 212, and a transistor 214. A gate of the transistor 210 is electrically connected to the word line 250. A first electrode of the transistor 210 is electrically connected to the other electrode of the capacitor 208 and the bit line 252. A second electrode of the transistor 210 is electrically connected to the one electrode of the capacitor 212 and a gate of the transistor 214. A first electrode of the transistor 214 is electrically connected to the reference potential line 258. A second electrode of the transistor 214 is electrically connected to the data line 254. The other electrode of the capacitor 212 is electrically connected to the read signal line 256. Here, the structure which includes the capacitor 212 and the transistor 214 corresponds to a functional circuit.

In this embodiment, the transistors 202, 204, 210, and 214 are n-channel transistors. With the use of n-channel transistors in which electrons with high mobility are used as carriers, a write operation and a read operation can be performed at high speed. Further, since relatively large current can flow through even a small n-channel transistor, the size of circuits can be reduced.

In the transistors 202, 204, 214, and 216 and a transistor included in the inverter 206, a single crystal semiconductor, a polycrystalline semiconductor, a microcrystalline semiconductor, an amorphous semiconductor, or the like can be used as a semiconductor in which a channel is formed. Examples of a semiconductor material are silicon, germanium, silicon germanium, silicon carbide, and gallium arsenide. A transistor including such a semiconductor material can operate at sufficiently high speed; thus, reading of stored data can be performed at high speed, for example. In other words, high-speed operation of the semiconductor device can be realized.

In the transistor 210, an oxide semiconductor can be used as a semiconductor in which a channel is formed. An oxide semiconductor has a wide energy gap of 3.0 eV or more. In a transistor obtained by processing an oxide semiconductor under appropriate conditions, the leakage current in the off state (off-state current) between a source and a drain per 1 μm of channel width can be 100 zA ($1 \times 10^{-19}$ A) or lower or 10 zA ($1 \times 10^{-20}$ A) or lower, and further can be 1 zA ($1 \times 10^{-21}$ A) or lower with a source-drain voltage of 3.5 V at an operating temperature (e.g., at 25° C.). Thus, a semiconductor device with low power consumption can be provided.

In this embodiment, the transistor 210 is an n-channel transistor employing an oxide semiconductor as a semiconductor in which a channel is formed.

The capacitor 208 can be omitted when the capacitance between the word line WL and the bit line BL, for example, is used as a substitute for the capacitor 208.

<Driving Method>

Figure 3:
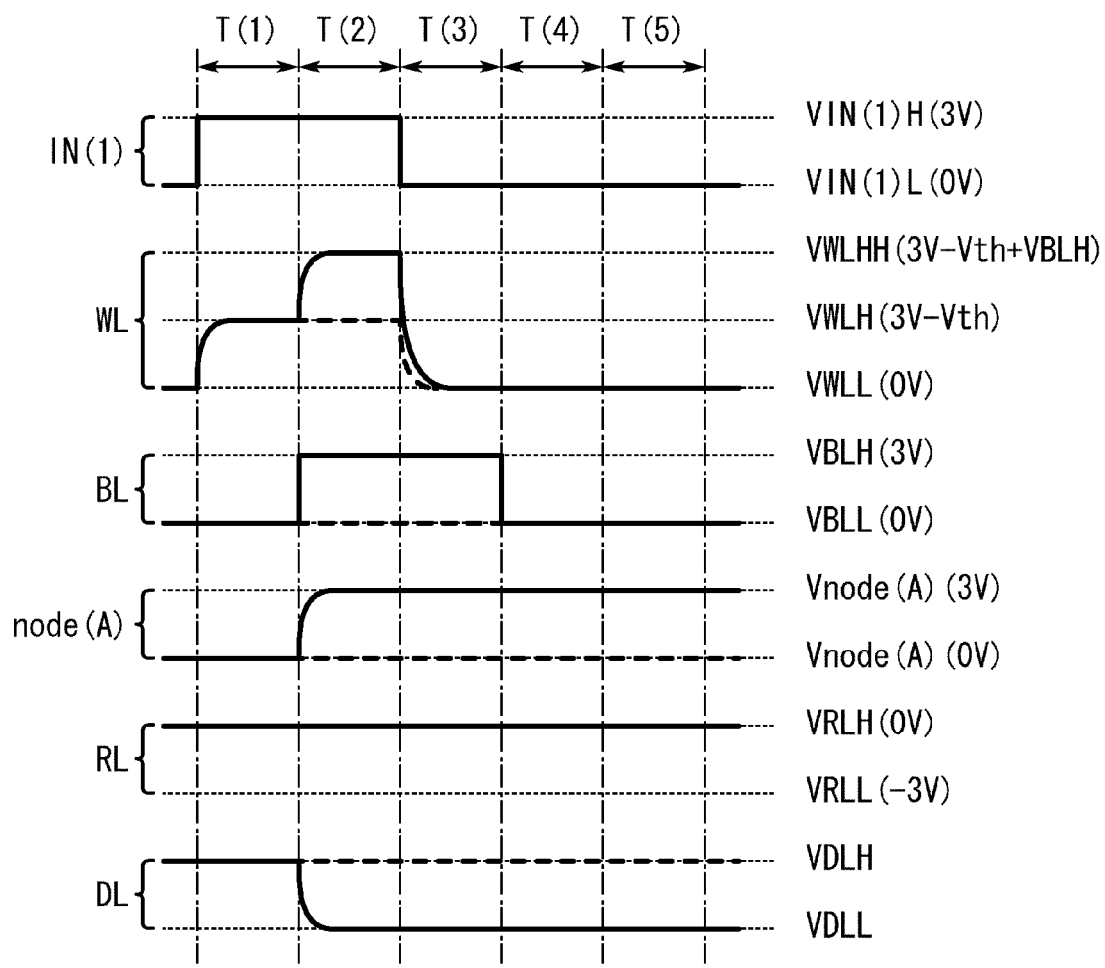
FIG. 3 is a timing chart of a storage device according to one embodiment of the present invention.

Next, a write operation and a read operation of the circuit illustrated in FIG. 2 will be described in detail with reference to a timing chart. The timing chart of FIG. 3 shows changes over time in the voltages and state of the signal lines and the node illustrated in FIG. 2.

Here, the input portion IN(1) in FIG. 2 is supplied with a high-level potential $V_{in(1)H}$ or a low-level potential $V_{in(1)L}$. The bit line 252 is supplied with a high-level potential $V_{BLH}$ or a low-level potential $V_{BLL}$. The read signal line 256 is supplied with a high-level potential $V_{RLH}$ or a low-level potential $V_{RLL}$.

In the circuit in this embodiment, the high-level potentials input to the input portion IN(1) and the bit line 252 can be the same potential as the power supply potential $V_{dd}$. Here, the power supply potential can be set as appropriate in consideration of transistor characteristics such as the threshold voltage of each transistor.

In this embodiment, as an example for explaining the write operation and the read operation of the circuit illustrated in FIG. 2, the threshold voltages ($V_{th}$) of the transistors 202, 204, 210, and 214 are assumed to be higher than or equal to 0 V and lower than 1.5 V; the threshold voltage of the transistor 216 is assumed to be higher than −1.5 V and lower than or equal to 0 V; and the power supply potential is 3 V.

Further, the high-level potential $V_{RLH}$ input to the read signal line 256 is a ground potential (0 V), and the low-level potential $V_{RLL}$ can be a potential that is lower than or equal to a negative power supply potential ($-V_{dd}$). In this embodiment, $V_{RLL}$ is −3 V.

Firstly, the write operation will be described with reference to the timing chart of FIG. 3. First, a method for writing a high-level potential into a node (node (A)) electrically connected to the gate of the transistor 214 is described. In the timing chart of FIG. 3, solid lines represent the changes over time in the voltages and state of the signal lines and the node at the time when a high-level potential is written into the node (A).

During the write operation, the potential of the read signal line RL is always $V_{RLH}$. The power supply potential $V_{dd}$ is applied to the power input portion VDD. The ground potential (0 V) is always applied to the ground potential input portion GND.

First, in a period T1, when the high-level potential $V_{in(1)H}$ is input to IN(1), the transistor 202 is turned on, and the potential of the word line WL is increased to $V_{WLH}$. Here, $V_{WLH}$ is a potential that is decreased from 3 V by the value of the threshold voltage ($V_{th}$) of the transistor 202, and thus is (3 V-$V_{th}$).

Next, in a period T2, a high-level potential $V_{BLH}$ is applied to the bit line BL while the potential of IN(1) is held. Consequently, the potential of the word line WL is increased by $V_{BLH}$ because of capacitive coupling of the capacitor 208 and becomes $V_{WLH}$. Here, $V_{WLHH}$ is (6 V-$V_{th}$).

Focusing on the transistor 210 here, a potential of (6 V-$V_{th}$) is applied to the gate and 3 V is applied to one of the source and the drain electrically connected to the bit line 252. The transistor 210 is therefore operated in a linear region, so that the potential of the node (node (A)) electrically connected to the gate of the transistor 214 is increased to 3 V, which is the power supply potential, without being adversely affected by threshold voltage drop of the transistor 210.

With the structure in which the capacitor 208 is electrically connected between the word line 250 and the bit line 252, the potential difference that is larger than the threshold voltage can be generated between the gate and each of the source and drain of the transistor 210; therefore, the same potential as the power supply potential can be written without adverse effect of threshold voltage drop between the source and the drain. Thus, it is not necessary to use a power supply voltage that is set high enough to compensate threshold voltage drop, so that data can be written with low power.

Even in the case where the threshold voltage of the transistor 210 is changed or the transistors 210 in a plurality of memory cells have variations in threshold voltage, by employing the above-described structure and applying sufficiently high voltage to the gate of the transistor 210, the same voltage can be written into the node (A) through the transistor 210 regardless of such change or variation in threshold voltage.

Further, data is written in the period T2 and the potential of the node (A) is raised, so that the transistor 214 is turned on. Thus, the potentials of the reference potential line 258 and the data line 254, which are electrically connected through the source and the drain of the transistor 214, become equal to the ground potential (0 V), and a low-level potential $V_{DLL}$ is output to the data line DL.

Next, in a period T3, IN(1) is set at the low-level potential $V_{in(1)L}$ while the potential of the bit line BL is kept at the high-level potential $V_{BLH}$. Consequently, the high-level potential $V_{in(1)H}$ which has been inverted by the inverter 206 is applied to the gate of the transistor 204, and the transistor 204 is turned on. Since the word line 250 and the ground potential input portion GND are electrically connected to each other through the source and the drain of the transistor 204, the potential of the word line WL is decreased to a low-level potential $V_{WLL}$. Thus, the transistor 210 is turned off in accordance with the decrease in the potential of the word line WL.

Finally, in a period T4, the potential of the bit line BL is set at the low-level potential $V_{BLL}$. At that time, the transistor 210 is kept off, so that the node (A) retains the potential ($V_{dd}$) written in the period T2.

Through the above series of steps for the write operation, the high-level potential can be written into the node (A).

Next, a method for writing data of a low-level potential into the node (A) will be described. In the timing chart of FIG. 3, dashed lines are used to indicate states different from those in the case where data of a high-level potential is written.

In order to write data of a low-level potential into the node (A), the potential of the bit line BL is kept at $V_{BLL}$ in the periods T2 and T3. At that time, although the potential of the word line WL is increased to the high-level potential $V_{WLH}$ and the transistor 210 is on, the potential of the bit line BL remains at the low-level potential $V_{BLL}$, so that the potential of the node (A) is kept at the low-level potential.

When the node (A) has the low-level potential, the transistor 214 is off. Consequently, the potential ($V_{DLH}$) that is decreased from the potential $V_{dd}$ input from the power input portion VDD by the value of the threshold voltage of the transistor 216 is output to the data line DL.

Through the above series of steps for the write operation, the low-level potential can be written into the node (A).

Next, a read operation will be described. A period T5 in FIG. 3 corresponds to a period for the read operation.

In order to read data, a low-level potential is applied to the input portion IN(1) and the bit line BL. Further, the high-level potential $V_{RLH}$ is applied to the read signal line RL. The state of the node (A) can be read by detection of the potential of the data line DL at that time. That is, the state where the potential of the data line DL is the low-level potential $V_{DLL}$ indicates that the high-level potential has been written into the node (A), whereas the state where the potential of the data line DL is the high-level potential $V_{DLH}$ indicates that the low-level potential has been written into the node (A).

In the storage device 100 illustrated in FIG. 1, the read operation can be performed row by row, that is, the read operation can be simultaneously performed on n memory cells placed in the row direction. At that time, the potential of the read signal line RL in rows that are not subjected to data reading is set at the low-level potential $V_{RLL}$.

When the potential of the read signal line RL is set at the low-level potential $V_{RLL}$, the potential of the node (A) is decreased by the potential $V_{RLL}$ because of capacitive coupling of the capacitor 212. Since $V_{RLL}$ is lower than the negative power supply potential $-V_{dd}$, the potential of the node (A) is decreased to a potential lower than 0 V even when the high-level potential $V_{dd}$ has been written into the node (A). Thus, the transistor 214 is always off regardless of the state of the node (A).

By thus performing the read operation, the state of the node (A) in a desired memory cell can be selectively read.

<Variation 1>

Next, one of variations of the storage device 100 will be described.

Figure 4:
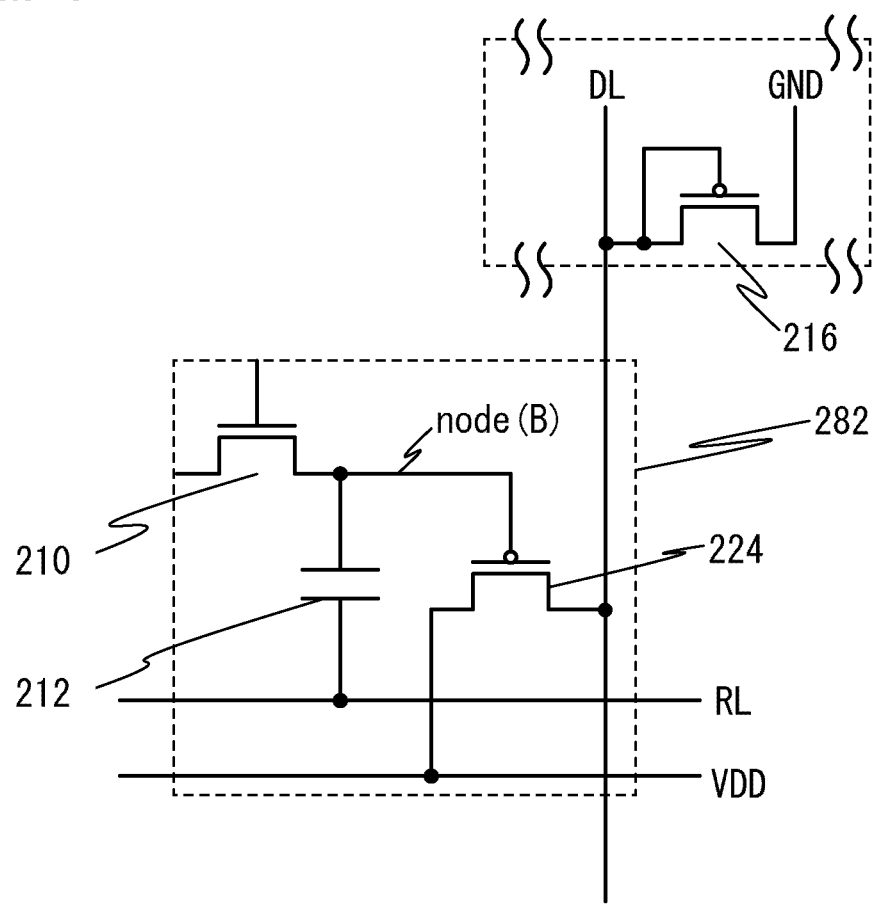
FIG. 4 illustrates a configuration of a storage device according to one embodiment of the present invention.

In the storage device 100, the transistor 214 may be a p-channel transistor. FIG. 4 illustrates the configuration in which a p-channel transistor is used as the transistor 214.

A memory portion 282 includes a p-channel transistor 224 instead of the transistor 214 in the memory portion 280. The structure of the memory portion 282 differs from that of the memory portion 280 in that a first electrode of the transistor 224 is electrically connected to the power input portion VDD instead of the ground potential input portion GND, and a second electrode of the transistor 216 electrically connected to the data line DL is electrically connected to the ground potential input portion GND instead of the power input portion VDD.

As for the write operation, in such a structure, a high-level potential and a low-level potential can be written into a node (B) in a manner similar to the above.

When a high-level potential is written into the node (B), the transistor 224 is turned off and a low-level potential is output to the data line DL. On the other hand, when a low-level potential is written into the node (B), the transistor 224 is turned on, so that a high-level potential is output to the data line DL.

Data can be read row by row as in the above structure. At that time, the read signal line RL in rows that are not selected are supplied with a potential equal to the power supply potential $V_{dd}$. When the low-level potential has been written into the node (B), by application of $V_{dd}$ to the read signal line RL, the potential of the node (B) is increased to $V_{dd}$ because of capacitive coupling of the capacitor 212, and the transistor 224 can be turned off. On the other hand, when the high-level potential has been written into the node (B), the potential of the node (B) is further increased, so that the transistor 224 is kept off. By thus applying the power supply potential $V_{dd}$ to the read signal line RL, the transistor 224 can be off regardless of the state of the node (B).

When a p-channel transistor is used as a transistor whose gate is electrically connected to the node (B) as described above, the read operation can be performed without using a negative power supply potential, so that the circuit configuration can be simplified.

<Variation 2>

Next, another variation of the storage device 100 will be described.

Figure 5A:
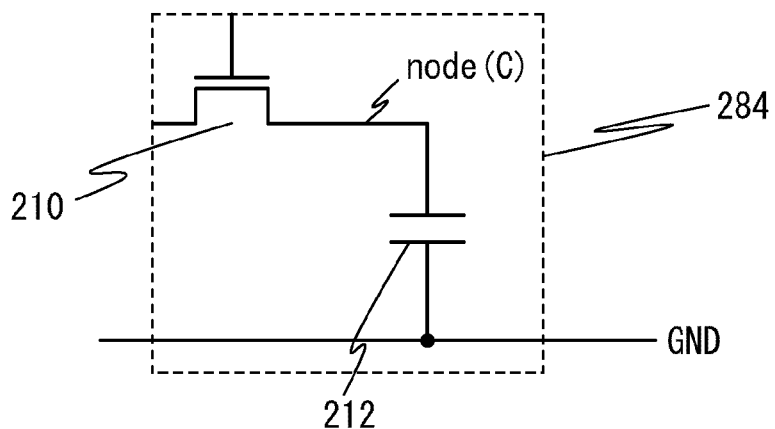
FIGS. 5A and 5B each illustrate a configuration of a storage device according to one embodiment of the present invention.

The memory portion 280 of the storage device 100 can be replaced with a memory portion 284 that includes only the n-channel transistor 210 and the capacitor 212 as illustrated in FIG. 5A. Although not illustrated, the gate of the transistor 210 is electrically connected to the word line WL, the first electrode thereof is electrically connected to the bit line BL, and the second electrode thereof is electrically connected to one electrode of the capacitor 212. The other electrode of the capacitor 212 is electrically connected to a reference potential line. In other words, the memory portion 284 is a memory element of DRAM. Here, the capacitor 212 electrically connected to the transistor 210 corresponds to a functional circuit.

As in the above structure, data can be stored by using a difference of the potential of a node (C). That is, data is stored with a difference between a high-level potential and a low-level potential of the node (C).

In the transistor 210, a single crystal semiconductor, a polycrystalline semiconductor, a microcrystalline semiconductor, an amorphous semiconductor, or the like can be used as a semiconductor in which a channel is formed. Examples of a semiconductor material are silicon, germanium, silicon germanium, silicon carbide, and gallium arsenide. A transistor including such a semiconductor material can operate at sufficiently high speed; thus, reading of stored data can be performed at high speed, for example. In other words, high-speed operation of the semiconductor device can be realized.

A data line and a read signal line are not necessary in such a structure, so that the circuit can be simplified. In addition, the memory element includes only one transistor and one capacitor, and thus can be reduced in size.

In the transistor 210, an oxide semiconductor can be used as a semiconductor in which a channel is formed. An oxide semiconductor has a wide energy gap of 3.0 eV or more. In a transistor obtained by processing an oxide semiconductor under appropriate conditions, the leakage current in the off state (off-state current) between a source and a drain per 1 μm of channel width can be 100 zA ($1 \times 10^{-19}$ A) or lower or 10 zA ($1 \times 10^{-20}$ A) or lower, and further can be 1 zA ($1 \times 10^{-21}$ A) or lower with a source-drain voltage of 3.5 V at an operating temperature (e.g., at 25° C.). Thus, a semiconductor device with low power consumption can be provided.

In addition, since the transistor including an oxide semiconductor has an extremely low off-state current, the potential of the node (C) can be retained for an extremely long time by turning off the transistor 210. Therefore, a refresh operation is not necessary or the interval between refresh operations can be much longer than conventional DRAM.

<Variation 3>

Next, a variation of the storage device 100 different from those described above will be described.

Figure 5B:
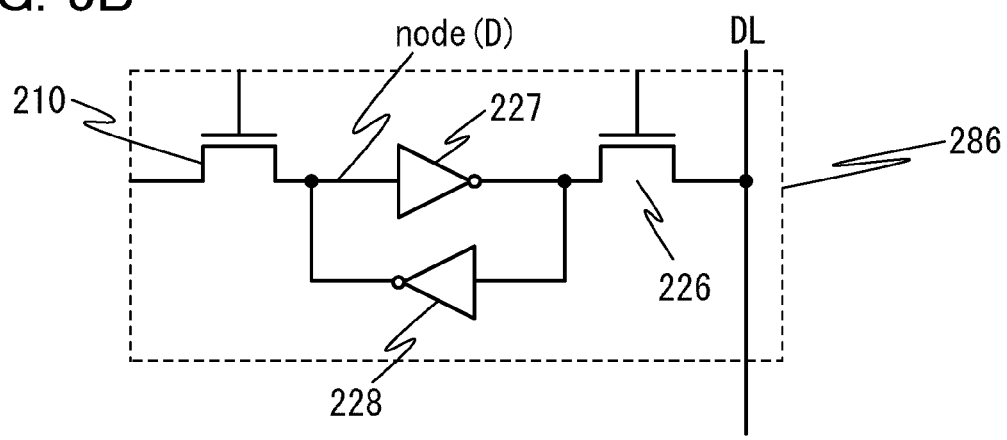

The memory portion 280 of the storage device 100 can be replaced with a memory portion 286 that includes two transistors and two inverters as illustrated in FIG. 5B. Here, the gate of the transistor 210 is electrically connected to the word line WL (not shown), and the first electrode of the transistor 210 is electrically connected to the bit line BL (not shown). The second electrode of the transistor 210 is electrically connected to an input portion of an inverter 227 and an output portion of an inverter 228. A gate of a transistor 226 is electrically connected to the word line WL (not shown). A first electrode of the transistor 226 is electrically connected to an output portion of the inverter 227 and an input portion of the inverter 228. A second electrode of the transistor 226 is electrically connected to the data line DL. In other words, the memory portion 286 is a memory element of SRAM. Note that a power supply line and a reference potential line electrically connected to the inverters are not illustrated for simplification. Here, the structure which includes inverter 227 and inverter 228 corresponds to a functional circuit.

Written data is stored as the potential of a node (D). That is, data can be stored with a difference between a high-level potential and a low-level potential of the node (D).

In order to read data, a voltage is applied to the word line WL to turn on the transistor 226, whereby the potential of the data line DL which is dependent on the state of the potential of the node (D) is output. The low-level potential is output to the data line DL when the node (D) has the high-level potential, whereas the high-level potential is output to the data line DL when the node (D) has the low-level potential.

Such a structure does not need a capacitor in the memory cell, so that the write operation and the read operation can be performed at extremely high speed.

In the storage device shown in this embodiment, a capacitor electrically connected between a word line and a bit line or capacitance between these lines is used and voltage application to the word line is performed prior to voltage application to the bit line in the write operation, so that the potential of the word line can be higher than that of the bit line; thus, threshold voltage drop at the time of data writing can be suppressed. Therefore, it is not necessary to use a power supply potential that is set high enough to compensate threshold voltage drop, and data can be written without increase in types of power supply potentials; thus, the write operation can be performed at low power.

This embodiment can be freely combined with any of the other embodiments disclosed in this specification.

Embodiment 2

One embodiment of the present invention can be applied to image display devices such as liquid crystal display devices, light-emitting display devices, and electronic paper. In this embodiment, a structure of a light-emitting display device, which is one embodiment of the present invention, will be described.

In this embodiment, as an example of a light-emitting display device, a structure including a light-emitting element utilizing electroluminescence will be described. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. Then, the carriers (electrons and holes) recombine, so that light is emitted. Owing to such a mechanism, the light-emitting element is referred to as a current-excitation light-emitting element.

Inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an organic EL element is used as a light-emitting element in this embodiment.

Figure 6:
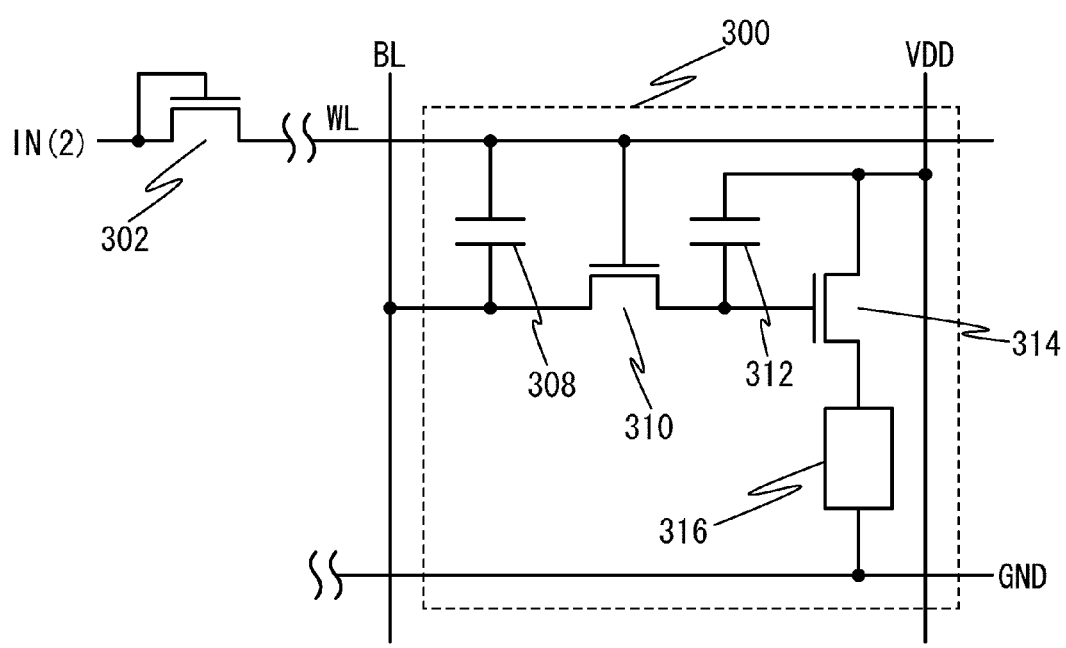
FIG. 6 illustrates a configuration of an image display device according to one embodiment of the present invention.

FIG. 6 illustrates an example of a pixel structure of a light-emitting display element exemplified in this embodiment. In this embodiment, an example of a pixel structure to which digital grayscale driving can be applied will be described.

A pixel 300 is placed in a region surrounded by a bit line BL, a word line WL, a power supply line VDD, and a reference potential line. A second electrode of a transistor 302 is electrically connected to the word line WL. A first electrode and a gate of the transistor 302 are electrically connected to an input portion IN(2). The power supply line VDD always supplies the power supply potential $V_{dd}$, and the reference potential line always supplies 0 V.

The pixel 300 includes a capacitor 308, a transistor 310, a transistor 314 for driving a light-emitting element, a capacitor 312, and a light-emitting element 316. One electrode of the capacitor 308 is electrically connected to the word line WL, and the other electrode thereof is electrically connected to the bit line BL. A gate of the transistor 310 is connected to the word line WL. A first electrode of the transistor 310 is electrically connected to the bit line BL. A second electrode of the transistor 310 is electrically connected to one electrode of the capacitor 312 and a gate of the transistor 314. The other electrode of the capacitor 312 and a first electrode of the transistor 314 are electrically connected to the power supply line VDD. A second electrode of the transistor 314 is electrically connected to a first electrode (pixel electrode) of the light-emitting element 316. A second electrode of the light-emitting element 316 is electrically connected to the reference potential line. Here, the structure which includes the capacitor 312, the transistor 314 and the light-emitting element 316 corresponds to a functional circuit.

Note that the second electrode of the light-emitting element 316 may be set at a low power supply potential. Note that the low power supply potential refers to a potential satisfying (the low power supply potential)<(a high power supply potential) with respect to the high power supply potential set at the power supply line VDD. As the low power supply potential, GND or 0V may be set, for example. The difference between the high power supply potential and the low power supply potential is applied to the light-emitting element 316 so that current flows through the light-emitting element 316, whereby the light-emitting element 316 emits light. In order to make the light-emitting element 316 emit light, each potential is set so that the difference between the high power supply potential and the low power supply potential is greater than or equal to the forward threshold voltage of the light-emitting element 316. In this embodiment, the low power supply potential is 0 V.

There are light-emitting elements having a top emission structure in which light is extracted through the surface opposite to the substrate, having a bottom emission structure in which light is extracted through the surface on the substrate side, and having a dual emission structure in which light is extracted through the surface opposite to the substrate and the surface on the substrate side. In the pixel structure in this embodiment, the light-emitting element 316 can have any of the above emission structures.

In the transistor 310, an oxide semiconductor can be used as a semiconductor in which a channel is formed. An oxide semiconductor has a wide energy gap of 3.0 eV or more. In a transistor obtained by processing an oxide semiconductor under appropriate conditions, the leakage current in the off state (off-state current) between a source and a drain per 1 μm of channel width can be 100 zA ($1\times10^{-19}$ A) or lower or 10 zA ($1\times10^{-20}$ A) or lower, and further can be 1 zA ($1\times10^{-21}$ A) or lower with a source-drain voltage of 3.5 V at an operating temperature (e.g., at 25° C.). Thus, a semiconductor device with low power consumption can be provided.

In addition, since the transistor including an oxide semiconductor has an extremely low off-state current, the gate potential of transistor 314 can be retained for an extremely long time by turning off the transistor 310 after data is written into the pixel. Therefore, display of a still image can be held for a long time without data rewriting, so that the display device with lower power consumption can be provided.

When the gate capacitance of the transistor 314 is used as a substitute for the capacitor 312, the capacitor 312 can be omitted. The gate capacitance of the transistor 314 may be formed between a channel region and a gate electrode layer.

The capacitor 308 can be omitted when the capacitance between the word line WL and the bit line BL, for example, is used as a substitute for the capacitor 308.

In order to write data into the pixel, a voltage is applied to the input portion IN(2) first, so that the potential of the word line WL is increased and the transistor 310 is turned on. Then, by application of voltage to the bit line BL, the potential of the word line WL is further increased because of capacitive coupling of the capacitor 308. Thus, a potential applied to the one electrode of the capacitor 312 and the gate of the transistor 314 is very close to the voltage of the bit line BL, without being adversely affected by threshold voltage drop of the transistor 310. At this time, the same potential as the potential input to the bit line BL can be applied to the word line WL.

When a voltage is applied to the gate of the transistor 314, the transistor 314 is turned on. Thus, a voltage is applied to the light-emitting element 316 and a current flows therethrough, whereby the light-emitting element 316 emits light.

Here, in the case of a voltage-input voltage driving method, a video signal with which the transistor 314 is either sufficiently turned on or sufficiently turned off is input as the gate potential of the transistor 314, that is, the potential of the bit line BL. That is, the transistor 314 is operated in a linear region. As the potential of the video signal with which the transistor 314 is sufficiently turned on, it is possible to use a voltage higher than the potential of the power supply line VDD, or at least a voltage higher than ($V_{dd}+V_{th}$ of the transistor 314).

In the case of employing analog grayscale driving instead of digital time grayscale driving, the same pixel structure as in FIG. 6 can be employed by inputting signals in a different way.

In analog grayscale driving, a voltage higher than or equal to (the forward voltage of the light-emitting element 316)+ ($V_{th}$ of the transistor 314) is applied to the gate of the transistor 314. The forward voltage of the light-emitting element 316 indicates a voltage at which a desired luminance is obtained, and includes at least a forward threshold voltage. By inputting a video signal to enable the transistor 314 to operate in a saturation region, a current can flow through the light-emitting element 316. In order to operate the transistor 314 in the saturation region, the potential of the power supply line VDD is set higher than the gate potential of the transistor 314. With the use of an analog video signal, it is possible to feed a current corresponding to the video signal to the light-emitting element 316 and perform analog grayscale driving.

Note that the pixel structure is not limited to that illustrated in FIG. 6. For example, a switch, a resistor, a capacitor, a transistor, a logic circuit, or the like may be added to the pixel illustrated in FIG. 6.

In the light-emitting display device shown in this embodiment, a capacitor electrically connected between a word line and a bit line or capacitance between these lines is used and voltage application to the word line is performed prior to voltage application to the bit line in the write operation, so that the potential of the word line can be higher than that of the bit line; thus, threshold voltage drop at the time of data writing can be suppressed. Therefore, it is not necessary to use a power supply potential that is set high enough to compensate threshold voltage drop, and data can be written without increase in types of power supply potentials; thus, the write operation can be performed at low power.

Even in the case where the threshold voltage of the transistor 310 is changed or the transistors 310 in a plurality of pixels have variations in threshold voltage, by employing the above-described structure and applying sufficiently high voltage to the gate of the transistor 310, the same voltage can be applied to the gate of the transistor 314 through the transistor 310 regardless of such change or variation in threshold voltage. Thus, change or variation in luminance is suppressed, so that the light-emitting display device can have high reliability.

This embodiment can be freely combined with any of the other embodiments disclosed in this specification.

Embodiment 3

In this embodiment, examples of a structure of a transistor including a semiconductor layer containing an oxide semiconductor, which can be applied to the semiconductor device according to one embodiment of the present invention, and a method for manufacturing the transistor will be described with reference to FIGS. 7A to 7E and FIGS. 8A to 8D.

Figure 7A:
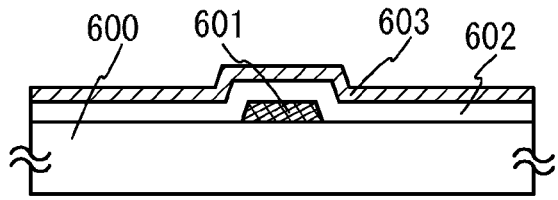
FIGS. 7A to 7E illustrate a transistor according to one embodiment of the present invention and a method for manufacturing the transistor.
Figure 7B:
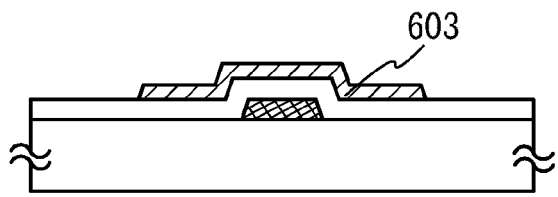
Figure 7C:
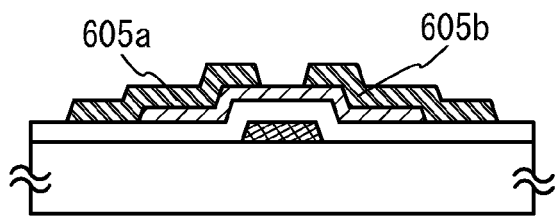
Figure 7D:
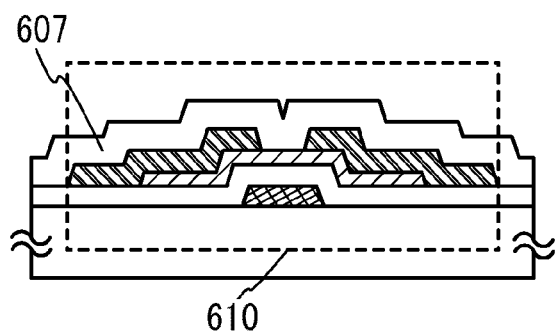

A transistor 610 illustrated in FIG. 7D is an example of inversed staggered transistors.

The inverted staggered transistor 610 includes a gate electrode layer 601 over a substrate 600; a gate insulating layer 602 that covers the gate electrode layer 601; an oxide semiconductor layer 603 that is in contact with the gate insulating layer 602 and overlaps with the gate electrode layer 601; a source electrode layer 605a and a drain electrode layer 605b in contact with edge portions of the oxide semiconductor layer 603; a first insulating layer 607 that covers exposed portions of the gate insulating layer 602, the source electrode layer 605a, the drain electrode layer 605b, and the oxide semiconductor layer 603; and a second insulating layer 609 that covers the first insulating layer 607.

An oxide semiconductor used for a semiconductor layer in this embodiment is an i-type (intrinsic) oxide semiconductor or a substantially i-type (intrinsic) oxide semiconductor. The i-type (intrinsic) oxide semiconductor or substantially i-type (intrinsic) oxide semiconductor is obtained in such a manner that hydrogen which might serve as a donor is removed from an oxide semiconductor, and the oxide semiconductor is purified so as to contain as few impurities that are not main components of the oxide semiconductor as possible.

Note that the purified oxide semiconductor includes extremely few carriers, and the carrier concentration is lower than $1\times10^{14}/cm^3$, preferably lower than $1\times10^{12}/cm^3$, further preferably lower than $1\times10^{11}/cm^3$. Further, since the number of carriers is small, the current in an off state (off-state current) is sufficiently low.

Specifically, in a transistor including the above oxide semiconductor layer, the off-state current per 1 μm of channel width at room temperature (25° C.) can be less than or equal to 100 zA ($1\times10^{-19}$ A), further less than or equal to 10 zA ($1\times10^{-20}$ A).

In the transistor 610 including the purified oxide semiconductor layer, the temperature dependence of on-state current is hardly observed, and the off-state current remains extremely low at high temperatures.

A process of manufacturing the transistor 610 over the substrate 600 will be described with reference to FIGS. 7A to 7E. FIGS. 7A to 7E are schematic cross-sectional views illustrating a process of manufacturing the transistor 610.

First, a conductive layer is formed over the substrate 600 having an insulating surface, and then, the gate electrode layer 601 is formed by a first photolithography process. Note that a resist mask used in the photolithography process may be formed by an inkjet method. Formation of the resist mask by an inkjet method needs no photomask; thus, manufacturing costs can be reduced.

There is no particular limitation on the substrate 600 as long as the substrate 600 has an insulating surface. In the case where heat treatment is performed in a later step, the substrate 600 needs to have at least heat resistance high enough to withstand the heat temperature. For example, a glass substrate of barium borosilicate glass, aluminoborosilicate glass, or the like, a quartz substrate, a sapphire substrate, or a ceramic substrate can be used. Alternatively, a metal substrate containing stainless steel or a semiconductor substrate having an insulating film formed on its surface may be used. A flexible substrate formed using a synthetic resin such as plastics generally tends to have a lower upper temperature limit than the above substrates; such a substrate can be used as long as it can withstand processing temperature in the manufacturing process. Note that the surface of the substrate 600 may be planarized by polishing such as CMP. In this embodiment, a glass substrate is used as the substrate 600.

An insulating layer serving as a base may be provided between the substrate 600 and the gate electrode layer 601. The insulating layer has a function of preventing diffusion of an impurity element from the substrate 600, and can be formed using one or more films selected from a silicon nitride film, a silicon oxide film, a silicon nitride oxide film, a silicon oxynitride film, and the like.

The gate electrode layer 601 can be formed using a metal material such as molybdenum, titanium, chromium, tantalum, tungsten, aluminum, copper, neodymium, or scandium; an alloy material containing any of these materials as a main component; or a conductive oxide. The gate electrode layer 601 can have a single-layer structure or a stacked structure.

Next, the gate insulating layer 602 is formed over the gate electrode layer 601. The gate insulating layer 602 can be formed by plasma CVD, sputtering, or the like. The gate insulating layer 602 can be formed using one or more films selected from a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, and the like.

In order that hydrogen, a hydroxyl group, and moisture are contained as little as possible in the gate insulating layer 602 and the oxide semiconductor layer 603, it is preferable that the substrate 600 where the gate electrode layer 601 is formed or the substrate 600 where the gate electrode layer 601 and the gate insulating layer 602 are formed be subjected to preheating in a preheating chamber of a sputtering apparatus as pretreatment for forming the oxide semiconductor layer 603 so that impurities such as hydrogen and moisture adsorbed on the substrate 600 are eliminated. As an exhaustion unit provided in the preheating chamber, a cryopump is preferably employed. This preheating treatment may be performed on the substrate 600 over which layers up to and including the source electrode layer 605a and the drain electrode layer 605b are formed. Note that this preheating treatment can be omitted.

Next, the oxide semiconductor layer 603 having a thickness of 2 nm to 200 nm, preferably 5 nm to 30 nm is formed over the gate insulating layer 602 (see FIG. 7A).

For the oxide semiconductor layer 603, any of the following oxide semiconductors can be used, for example: an oxide of four metal elements, such as an In—Sn—Ga—Zn—O-based oxide, an In—Sn—Al—Zn—O-based oxide, an In—Sn—Hf—Zn—O-based oxide, and In—Hf—Al—Zn—O-based oxide; an oxide of three metal elements, such as an In—Ga—Zn—O-based oxide, an In—Sn—Zn—O-based oxide, an In—Al—Zn—O-based oxide, a Sn—Ga—Zn—O-based oxide, an Al—Ga—Zn—O-based oxide, a Sn—Al—Zn—O-based oxide, an In—Hf—Zn—O-based oxide, an In—La—Zn—O-based oxide, an In—Ce—Zn—O-based oxide, an In—Pr—Zn—O-based oxide, an In—Nd—Zn—O-based oxide, an In—Sm—Zn—O-based oxide, an In—Eu—Zn—O-based oxide, an In—Gd—Zn—O-based oxide, an In—Tb—Zn—O-based oxide, an In—Dy—Zn—O-based oxide, an In—Ho—Zn—O-based oxide, an In—Er—Zn—O-based oxide, an In—Tm—Zn—O-based oxide, an In—Yb—Zn—O-based oxide, and an In—Lu—Zn—O-based oxide; an oxide of two metal elements, such as an In—Zn—O-based oxide, a Sn—Zn—O-based oxide, an Al—Zn—O-based oxide, a Zn—Mg—O-based oxide, a Sn—Mg—O-based oxide, an In—Mg—O-based oxide, an In—Ga—O-based oxide, and an In—Sn—O-based oxide; an In—O-based oxide; a Sn—O-based oxide; and a Zn—O-based oxide. Further, $SiO_2$ may be contained in the above oxide. For example, an In—Ga—Zn—O-based oxide means an oxide containing indium (In), gallium (Ga), and zinc (Zn), and there is no particular limitation on the composition ratio. The In—Ga—Zn—O-based oxide may contain an element other than In, Ga, and Zn.

For the oxide semiconductor layer 603, a thin film represented by $InMO_3(ZnO)_m$ (m is greater than 0 and is not a natural number) can be used. Here, M represents one or more metal elements selected from Ga, Al, Mn, and Co. For example, M can be Ga, Ga and Al, Ga and Mn, or Ga and Co.

As a target for forming the oxide semiconductor layer 603 by sputtering, a metal oxide target containing zinc oxide as its main component can be used. As another example of a metal oxide target, an oxide semiconductor target containing In, Ga, and Zn (the composition ratio of $In_2O_3:Ga_2O_3:ZnO=1:1:1$ [molar ratio]) can be used. Alternatively, an oxide semiconductor target containing In, Ga, and Zn (the composition ratio of $In_2O_3:Ga_2O_3:ZnO=2:2:1$ or 1:1:4 [molar ratio]) can be used. The filling rate of the oxide semiconductor target is 90% to 100%, preferably 95% to 99.9%. With the use of the oxide semiconductor target with a high filling rate, a dense oxide semiconductor layer can be deposited. The purity of the target is preferably 99.99% or higher. In particular, it is preferable that impurities, for example, an alkali metal such as Li or Na and an alkaline earth metal such as Ca be reduced.

In this embodiment, the oxide semiconductor layer having an amorphous structure is formed by sputtering using an In—Ga—Zn—O-based metal oxide target.

The atmosphere in which the oxide semiconductor layer 603 is formed is preferably a rare gas (typically, argon) atmosphere, an oxygen atmosphere, or a mixed atmosphere of a rare gas (typically, argon) and oxygen. Specifically, it is preferable to use a high-purity gas atmosphere, for example, from which impurities such as hydrogen, water, a hydroxyl group, or a hydride are removed to a concentration of 1 ppm or less (preferably 10 ppb or less).

In the formation of the oxide semiconductor layer 603, for example, an object to be processed is held in a treatment chamber that is kept under reduced pressure and the object is heated so that the temperature of the object is higher than or equal to 100° C. and lower than 550° C., preferably 150° C. to 450° C., further preferably 200° C. to 400° C. In particular, the temperature range of 250° C. to 320° C. is preferable for dehydration. Then, a sputtering gas from which hydrogen, water, and the like are removed is introduced into the treatment chamber while moisture in the treatment chamber is removed, and the oxide semiconductor layer 603 is formed using the aforementioned target. By forming the oxide semiconductor layer 603 while the object is heated, impurities in the oxide semiconductor layer can be reduced. Moreover, damage due to sputtering can be reduced. In order to remove moisture in the treatment chamber, an entrapment vacuum pump is preferably used. For example, a cryopump, an ion pump, a titanium sublimation pump, or the like can be used. A turbo molecular pump provided with a cold trap may be used. Since hydrogen, a compound containing a hydrogen atom, such as water, or the like (preferably a compound containing a carbon atom as well) can be removed from the treatment chamber by evacuating the chamber with a cryopump or the like, the impurity concentration of the oxide semiconductor layer 603 can be reduced.

The oxide semiconductor layer 603 can be formed under the following conditions, for example: the distance between the object to be processed and the target is 170 mm; the pressure is 0.4 Pa; the direct-current (DC) power is 0.5 kW; and the atmosphere is an oxygen (the proportion of oxygen is 100%) atmosphere, an argon (the proportion of argon is 100%) atmosphere, or a mixed atmosphere of oxygen and argon. Note that a pulsed DC power source is preferably used because dust (such as powder substances generated in film formation) can be reduced and the film thickness can be made uniform. The thickness of the oxide semiconductor layer 603 is 1 nm to 50 nm, preferably 1 nm to 30 nm, further preferably 1 nm to 10 nm. Using the oxide semiconductor layer 603 with such a thickness can suppress the short-channel effect due to miniaturization. Note that an appropriate thickness differs depending on an oxide semiconductor material used, the application of a semiconductor device, or the like; therefore, the thickness can be determined as appropriate depending on the material to be used, the intended use, or the like.

Note that before the oxide semiconductor layer 603 is formed by sputtering, a substance attached to a surface where the oxide semiconductor layer 603 is to be formed (e.g., a surface of the gate insulating layer 602) is preferably removed by reverse sputtering in which an argon gas is introduced and plasma is generated. Here, reverse sputtering is a method by which ions collide with a surface to be processed so that the surface is modified. An example of a method for making ions collide with a surface to be processed is a method in which high-frequency voltage is applied to the surface to be processed in an argon atmosphere so that plasma is generated in the vicinity of the object to be processed. Note that an atmosphere of nitrogen, helium, oxygen, or the like may be used instead of an argon atmosphere.

Then, the oxide semiconductor layer 603 is processed into the island-shaped oxide semiconductor layer 603 through a second photolithography process (see FIG. 7B). Note that a resist mask used in the photolithography process may be formed by an inkjet method. Formation of the resist mask by an inkjet method needs no photomask; thus, manufacturing costs can be reduced.

In the case where a contact hole is formed in the gate insulating layer 602, the contact hole can be formed at the same time as processing of the oxide semiconductor layer 603.

Note that the etching of the oxide semiconductor layer 603 may be dry etching, wet etching, or both dry etching and wet etching. As an etchant used for wet etching of the oxide semiconductor layer 603, a mixed solution of phosphoric acid, acetic acid, and nitric acid can be used, for example. Alternatively, ITO-07N (produced by Kanto Chemical Co., Inc.) may be used.

After that, heat treatment (first heat treatment) is performed on the oxide semiconductor layer 603. By the first heat treatment, excessive hydrogen (including water and a hydroxyl group) in the oxide semiconductor layer is removed and a structure of the oxide semiconductor layer is improved, so that defect levels in the energy gap can be reduced. The temperature of the first heat treatment is, for example, higher than or equal to 300° C. and lower than 550° C., or higher than or equal to 400° C. and lower than or equal to 500° C.

The heat treatment can be performed in such a way that, for example, an object to be heated is introduced into an electric furnace using a resistance heating element or the like, and heated at 450° C. for one hour in a nitrogen atmosphere. During the heat treatment, the oxide semiconductor layer is not exposed to the air to prevent the entry of water and hydrogen.

The heat treatment apparatus is not limited to the electric furnace and may be an apparatus for heating an object by thermal radiation or thermal conduction from a medium such as a heated gas. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the gas, an inert gas which does not react with an object by heat treatment, such as nitrogen or a rare gas like argon, is used.

For example, as the first heat treatment, GRTA may be performed in the following manner: the object is put into an inert gas atmosphere that has been heated, heated for several minutes, and taken out of the inert gas atmosphere. The GRTA process enables high-temperature heat treatment for a short time. Further, the GRTA process can be employed even when the temperature exceeds the upper temperature limit of the object. Note that the inert gas may be switched to a gas including oxygen during the process. This is because defect levels in the energy gap due to oxygen vacancy can be reduced by performing the first heat treatment in an atmosphere including oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is 6 N (99.9999%) or higher, preferably 7 N (99.99999%) or higher (i.e., the impurity concentration is 1 ppm or lower, preferably 0.1 ppm or lower).

In any case, impurities are reduced by the first heat treatment so that the i-type (intrinsic) or substantially i-type oxide semiconductor layer is obtained. Consequently, a transistor having significantly excellent characteristics can be realized.

The above heat treatment (first heat treatment) has an effect of removing hydrogen, water, and the like and thus can be referred to as dehydration treatment, dehydrogenation treatment, or the like. The dehydration treatment or dehydrogenation treatment can be performed before the oxide semiconductor layer 603 is processed into an island shape. Such dehydration treatment or dehydrogenation treatment may be conducted once or plural times.

The first heat treatment can be performed at any of the following timings instead of the above timing: after formation of a source electrode layer and a drain electrode layer, and after formation of an insulating layer over the source electrode layer and the drain electrode layer.

Next, a conductive film to be a source electrode layer and a drain electrode layer (as well as a wiring) is formed over the gate insulating layer 602 and the oxide semiconductor layer 603. For the conductive film used for the source electrode layer and the drain electrode layer, an element selected from Al, Cr, Cu, Ta, Ti, Mo, and W, an alloy containing any of these elements as a component, or an alloy in which any of these elements are combined can be used, for example. Alternatively, the conductive film may have a structure in which a refractory metal film such as a Ti film, a Mo film, or a W film is stacked on one or both of a top surface and a bottom surface of a metal film such as an Al film or a Cu film. With the use of an Al material to which an element (e.g., Si, Nd, or Sc) that prevents generation of hillocks and whiskers in an Al film is added, heat resistance can be increased. The source electrode layer and the drain electrode layer may be formed using a conductive metal oxide. As the conductive metal oxide, indium oxide ($In_2O_3$), tin oxide ($SnO_2$), zinc oxide (ZnO), an alloy of indium oxide and tin oxide ($In_2O_3$—$SnO_2$, referred to as ITO), an alloy of indium oxide and zinc oxide ($In_2O_3$—ZnO), or any of these metal oxide materials in which silicon oxide is contained can be used.

Next, through a third photolithography process, a resist mask is formed over the conductive film and selective etching is performed to form the source electrode layer 605a and the drain electrode layer 605b, and then the resist mask is removed (see FIG. 7C).

Light exposure at the time of forming the resist mask in the third photolithography process may be performed with ultraviolet light, KrF laser light, or ArF laser light. Note that the channel length (L) of the transistor is determined by the distance between the source electrode layer and the drain electrode layer. Therefore, in light exposure for forming a mask that is used for forming a transistor with a channel length (L) of less than 25 nm, it is preferable to use extreme ultraviolet light whose wavelength is as short as several nanometers to several tens of nanometers. In the light exposure by extreme ultraviolet light, the resolution is high and the focus depth is large. For those reasons, the channel length (L) of the transistor, which is completed later, can be in the range of 10 nm to 1000 nm (1 μm), and the circuit can operate at higher speed. Further, miniaturization can lead to lower power consumption of a semiconductor device.

In order to reduce the number of photomasks and the number of steps in the photolithography process, the etching step may be performed using a resist mask formed by a multi-tone mask. Since a resist mask formed with a multi-tone mask includes regions of plural thicknesses and can be further changed in shape by etching, the resist mask can be used in a plurality of etching steps to provide different patterns. Therefore, a resist mask corresponding to at least two different patterns can be formed with one multi-tone mask. Thus, the number of light-exposure masks can be reduced and the number of corresponding photolithography processes can also be reduced, whereby the process can be simplified.

Note that it is preferable that etching conditions be optimized so as not to etch and divide the oxide semiconductor layer 603 when the conductive film is etched. However, it is difficult to obtain etching conditions in which only the conductive film is etched and the oxide semiconductor layer 603 is not etched at all. In some cases, part of the oxide semiconductor layer 603 is etched when the conductive film is etched, whereby the oxide semiconductor layer 603 has a groove portion (a recessed portion).

Either wet etching or dry etching may be used for the etching of the conductive film. Note that dry etching is preferably used in terms of miniaturization of the element. An etching gas or an etchant can be selected as appropriate depending on materials of layers to be etched. In this embodiment, a titanium film is used as the conductive film and an In—Ga—Zn—O-based material is used for the oxide semiconductor layer 603; when wet etching is employed, an ammonia peroxide mixture (31 wt % hydrogen peroxide solution:28 wt % ammonia water:water=5:2:2) can be used as an etchant, for example.

Next, plasma treatment using a gas such as $N_2O$, $N_2$, or Ar is preferably performed to remove hydrogen, water, or the like attached to an exposed surface of the oxide semiconductor layer. In the case where the plasma treatment is performed, the first insulating layer 607 serving as a protective insulating layer is continuously formed without exposure of the oxide semiconductor layer to the air.

The first insulating layer 607 is preferably formed to a thickness of at least 1 nm by a method through which impurities such as water or hydrogen are not introduced into the first insulating layer 607, such as sputtering. If hydrogen is contained in the first insulating layer 607, hydrogen might enter the oxide semiconductor layer or extract oxygen in the oxide semiconductor layer, which might cause a reduction in resistance of a backchannel of the oxide semiconductor layer (make the backchannel have n-type conductivity); thus, a parasitic channel may be formed. As the first insulating layer 607, a silicon oxide film, a silicon oxynitride film, an aluminum oxide film, an aluminum oxynitride film, a gallium oxide film, or the like is preferably used.

In this embodiment, a 200-nm-thick silicon oxide film is formed as the first insulating layer 607 by sputtering. The substrate temperature in deposition is higher than or equal to room temperature (25° C.) and lower than or equal to 300° C., and is 100° C. in this embodiment. The silicon oxide film can be deposited by sputtering in a rare gas (typically, argon) atmosphere, an oxygen atmosphere, or a mixed atmosphere containing a rare gas and oxygen. As a target, a silicon oxide target or a silicon target can be used.

In order to remove remaining moisture in the deposition chamber of the first insulating layer 607 as in the case of the deposition of the oxide semiconductor layer 603, an entrapment vacuum pump (e.g., a cryopump) is preferably used. When the first insulating layer 607 is deposited in the deposition chamber evacuated using a cryopump, the impurity concentration of the first insulating layer 607 can be reduced. A turbo molecular pump provided with a cold trap may be used as an evacuation unit for removing moisture remaining in the deposition chamber used for forming the first insulating layer 607.

It is preferable that a high-purity gas from which impurities such as hydrogen or water are removed be used as the sputtering gas for forming the first insulating layer 607.

Next, second heat treatment is performed in an inert gas atmosphere or an oxygen atmosphere. The second heat treatment is performed at 200° C. to 450° C., preferably 250° C. to 350° C. For example, the heat treatment may be performed at 250° C. for one hour in a nitrogen atmosphere. The second heat treatment can reduce variation in electric characteristics of the transistor. By the supply of oxygen from the first insulating layer 607 to the oxide semiconductor layer 603, oxygen vacancies in the oxide semiconductor layer 603 can be filled, whereby an intrinsic (i-type) or substantially intrinsic oxide semiconductor layer can be formed.

Note that the second heat treatment is performed after the formation of the first insulating layer 607 in this embodiment; there is no particular limitation on the timing of the second heat treatment. For example, the first heat treatment may be followed by the second heat treatment, or the first heat treatment may double as the second heat treatment.

In the above manner, with the first heat treatment and the second heat treatment, the oxide semiconductor layer 603 can be purified so as not to contain impurities other than the main components, whereby the oxide semiconductor layer 603 can be an i-type (intrinsic) oxide semiconductor layer.

Through the above process, the transistor 610 is formed (see FIG. 7D).

Figure 7E:
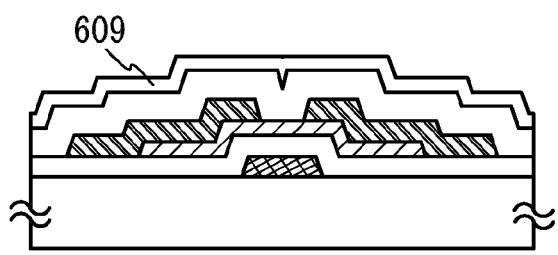

Further, the second insulating layer 609 is preferably formed over the first insulating layer 607 (see FIG. 7E). The second insulating layer 609 prevents entry of hydrogen, water, or the like from the outside. As the second insulating layer 609, a silicon nitride film or an aluminum nitride film can be used, for example. There is no particular limitation on the method for forming the second insulating layer 609; RF sputtering is suitable because of its high productivity. In addition, an organic material such as polyimide, acrylic, or benzocyclobutene can be used for the second insulating layer 609. With the use of such an organic material, the insulating properties can be further improved. The second insulating layer 609 may be a stack of the above materials, and for example, can have a structure where a polyimide film is stacked over a silicon nitride film. The second insulating layer 609 having such a structure can prevent entry of water, hydrogen, or the like and enhance the insulating properties.

After the second insulating layer 609 is formed, heat treatment may be performed at 100° C. to 200° C. for 1 hour to 30 hours in the air.

<Variations>

Transistors having a structure different from that of the inversed staggered transistor 610 shown in this embodiment will be described below. Each transistor having a structure to be described below includes a purified oxide semiconductor layer and thus has a sufficiently low leakage current.

Figure 8A:
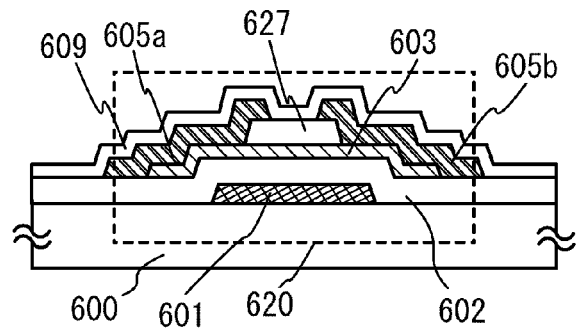
FIGS. 8A to 8D each illustrate a transistor according to one embodiment of the present invention.

A transistor 620 illustrated in FIG. 8A has an inverted staggered structure different from that of the transistor 610.

The transistor 620 includes a channel protective layer 627 placed so as to cover a channel formation region of the oxide semiconductor layer 603. By the formation of the channel protective layer 627 over the channel formation region, damage to the oxide semiconductor layer 603 due to etching is reduced when the source electrode layer 605a and the drain electrode layer 605b are formed in the manufacturing process; thus, the transistor can have high reliability.

Figure 8B:
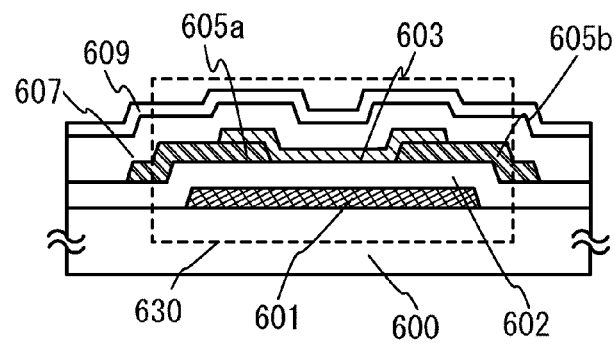

A transistor 630 illustrated in FIG. 8B has a bottom-gate structure different from those of the transistors 610 and 620.

The transistor 630 has a structure in which the stacking order of the source and drain electrode layers 605a and 605b and the oxide semiconductor layer 603 is reversed from that in the transistor 610. That is, the source electrode layer 605a and the drain electrode layer 605b are formed with a gap therebetween over the gate insulating layer 602, and the oxide semiconductor layer 603 is formed so as to cover the gap.

With such a structure, damage to the oxide semiconductor layer 603 due to etching for forming the source electrode layer 605a and the drain electrode layer 605b is reduced; thus, the transistor can have high reliability.

Figure 8C:
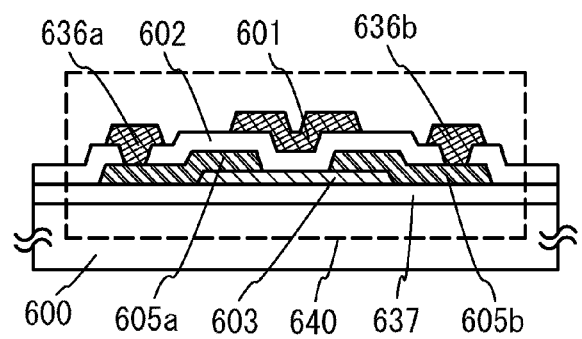

A transistor 640 illustrated in FIG. 8C is a top gate transistor.

In the transistor 640, a base insulating layer 637, the oxide semiconductor layer 603, the source electrode layer 605a and the drain electrode layer 605b, the gate insulating layer 602, and the gate electrode layer 601 are formed in this order over the substrate 600. The transistor 640 also includes a source wiring layer 636a and a drain wiring layer 636b that are electrically connected to the source electrode layer 605a and the drain electrode layer 605b through contact holes formed in the gate insulating layer 602.

Figure 8D:
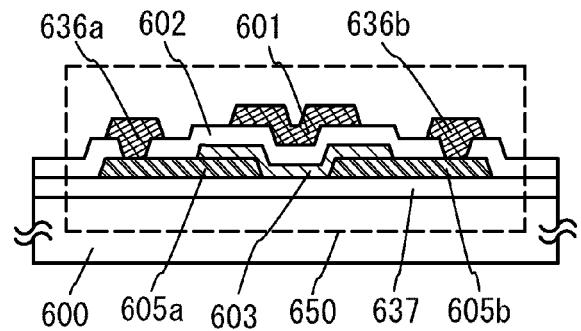

A transistor 650 illustrated in FIG. 8D is a staggered transistor which is one of top-gate transistors.

The transistor 650 has a structure in which the stacking order of the oxide semiconductor layer 603 and the source and drain electrode layers 605a and 605b is reversed from that in the transistor 640. That is, the source electrode layer 605a and the drain electrode layer 605b are formed with a gap therebetween over the base insulating layer 637, and the oxide semiconductor layer 603 is formed so as to cover the gap.

The transistors such as the transistors 640 and 650 have a structure in which the channel formation region in the oxide semiconductor layer 603 is sandwiched between the gate insulating layer 602 and the base insulating layer 637. Therefore, these layers can prevent impurities from entering the oxide semiconductor layer 603, so that the transistor can have high reliability.

With the use of the purified oxide semiconductor layer formed according to this embodiment, the leakage current of the transistor can be sufficiently reduced. Therefore, a semiconductor device with low power consumption can be formed by using the transistor in part of circuits. In addition, by using the transistor having an extremely low leakage current as a selection transistor, data can be retained for a long time even when data is written at low voltage. Thus, it is possible to realize a semiconductor device that can perform a write operation at low voltage and thus consumes less power.

Embodiment 4

In this embodiment, examples of an electronic device to which the semiconductor device described in the above embodiment is applied will be described with reference to FIGS. 9A to 9F. Specifically, this embodiment explain applications of the semiconductor device described in the above embodiment to electronic devices such as a computer, a mobile phone (also referred to as a mobile phone device or a cell phone), a personal digital assistant (including a portable game machine and an audio reproducing device), a camera such as a digital camera and a digital video camera, electronic paper, and a television device (also referred to as a television or a television receiver).

Figure 9A:
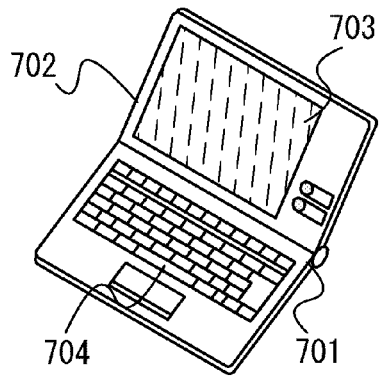
FIGS. 9A to 9F each illustrate an electronic device according to one embodiment of the present invention.

FIG. 9A illustrates a laptop personal computer including a housing 701, a housing 702, a display portion 703, a keyboard 704, and the like. The semiconductor device described in the above embodiment is provided in each of the housings 701 and 702. Thus, it is possible to realize a laptop personal computer in which a write voltage is lowered in the write operation without increase in types of power supply potentials, and power consumption in the write operation is sufficiently low.

Figure 9D:
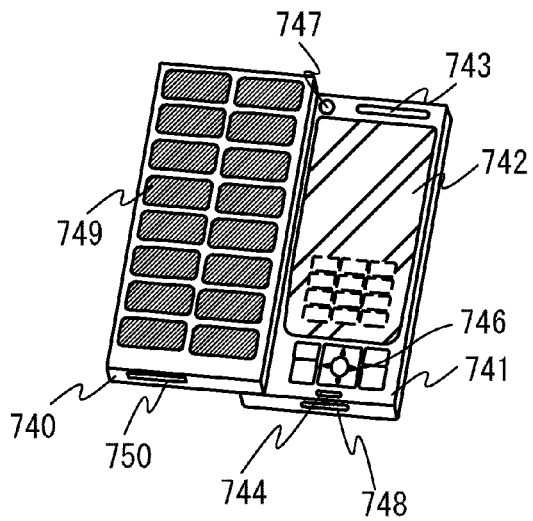
Figure 9B:
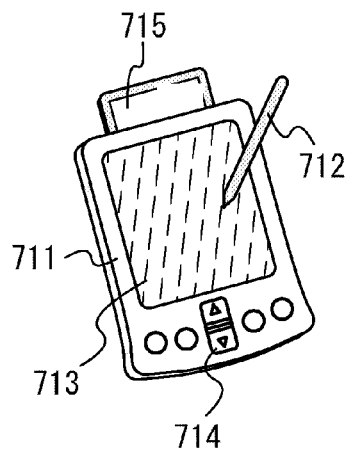

FIG. 9B illustrates a personal digital assistant (PDA). A main body 711 is provided with a display portion 713, an external interface 715, operation buttons 714, and the like. Further, a stylus 712 or the like for operating the personal digital assistant is provided. The semiconductor device described in the above embodiment is provided in the main body 711. Thus, it is possible to realize a personal digital assistant in which a write voltage is lowered in the write operation without increase in types of power supply potentials, and power consumption in the write operation is sufficiently low.

Figure 9E:
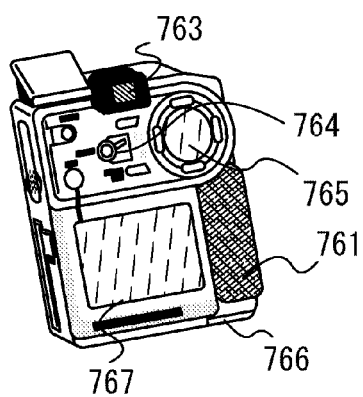
Figure 9C:
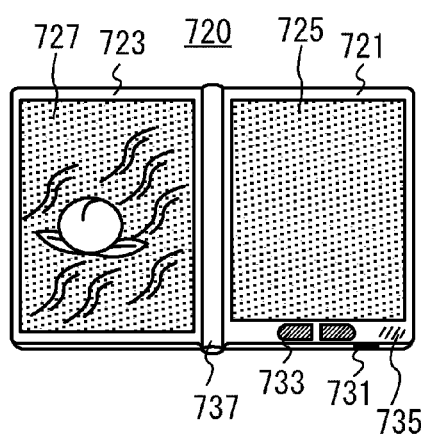

FIG. 9C illustrates an e-book reader 720 including electronic paper, and the e-book reader 720 includes two housings of a housing 721 and a housing 723. The housing 721 and the housing 723 are provided with a display portion 725 and a display portion 727, respectively. The housings 721 and 723 are connected by a hinge portion 737 and can be opened or closed with the hinge portion 737. The housing 721 is provided with a power switch 731, an operation key 733, a speaker 735, and the like. At least one of the housings 721 and 723 is provided with the semiconductor device described in the above embodiment. Thus, it is possible to realize an e-book reader in which a write voltage is lowered in the write operation without increase in types of power supply potentials, and power consumption in the write operation is sufficiently low.

FIG. 9D illustrates a mobile phone including two housings of a housing 740 and a housing 741. The housing 740 and the housing 741 developed as illustrated in FIG. 9D can shift by sliding so that one is lapped over the other; therefore, the size of the mobile phone can be reduced, which makes the mobile phone suitable for being carried. The housing 741 is provided with a display panel 742, a speaker 743, a microphone 744, a pointing device 746, a camera lens 747, an external connection terminal 748, and the like. The housing 740 is provided with a solar cell 749 for charging the mobile phone, an external memory slot 750, and the like. An antenna is incorporated in the housing 741. At least one of the housings 740 and 741 is provided with the semiconductor device described in the above embodiment. Thus, it is possible to realize a mobile phone in which a write voltage is lowered in the write operation without increase in types of power supply potentials, and power consumption in the write operation is sufficiently low.

FIG. 9E illustrates a digital camera including a main body 761, a display portion 767, an eyepiece 763, an operation switch 764, a display portion 765, a battery 766, and the like. The semiconductor device described in the above embodiment is provided in the main body 761. Thus, it is possible to realize a digital camera in which a write voltage is lowered in the write operation without increase in types of power supply potentials, and power consumption in the write operation is sufficiently low.

Figure 9F:
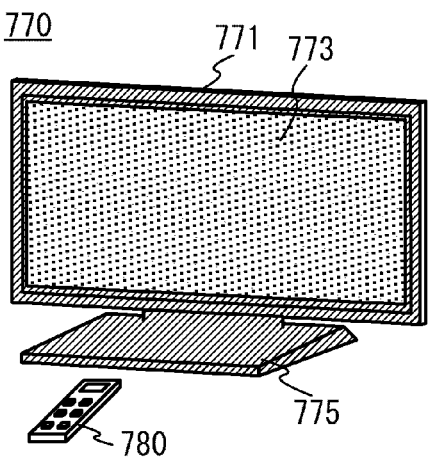

FIG. 9F illustrates a television device 770 including a housing 771, a display portion 773, a stand 775, and the like. The television device 770 can be operated with an operation switch of the housing 771 or a remote controller 780. The housing 771 and the remote controller 780 are each provided with the semiconductor device described in the above embodiment. Thus, it is possible to realize a television device in which a write voltage is lowered in the write operation without increase in types of power supply potentials, and power consumption in the write operation is sufficiently low.

As described above, the electronic device described in this embodiment includes the semiconductor device described in the above embodiment. Therefore, in the electronic device, power consumption in the write operation is reduced without increase in types of power supply potentials.

Example 1

In this example, the results of calculating input-output characteristics of the memory circuit according to one embodiment of the present invention will be described.
<Circuit Configuration>

Figure 10:
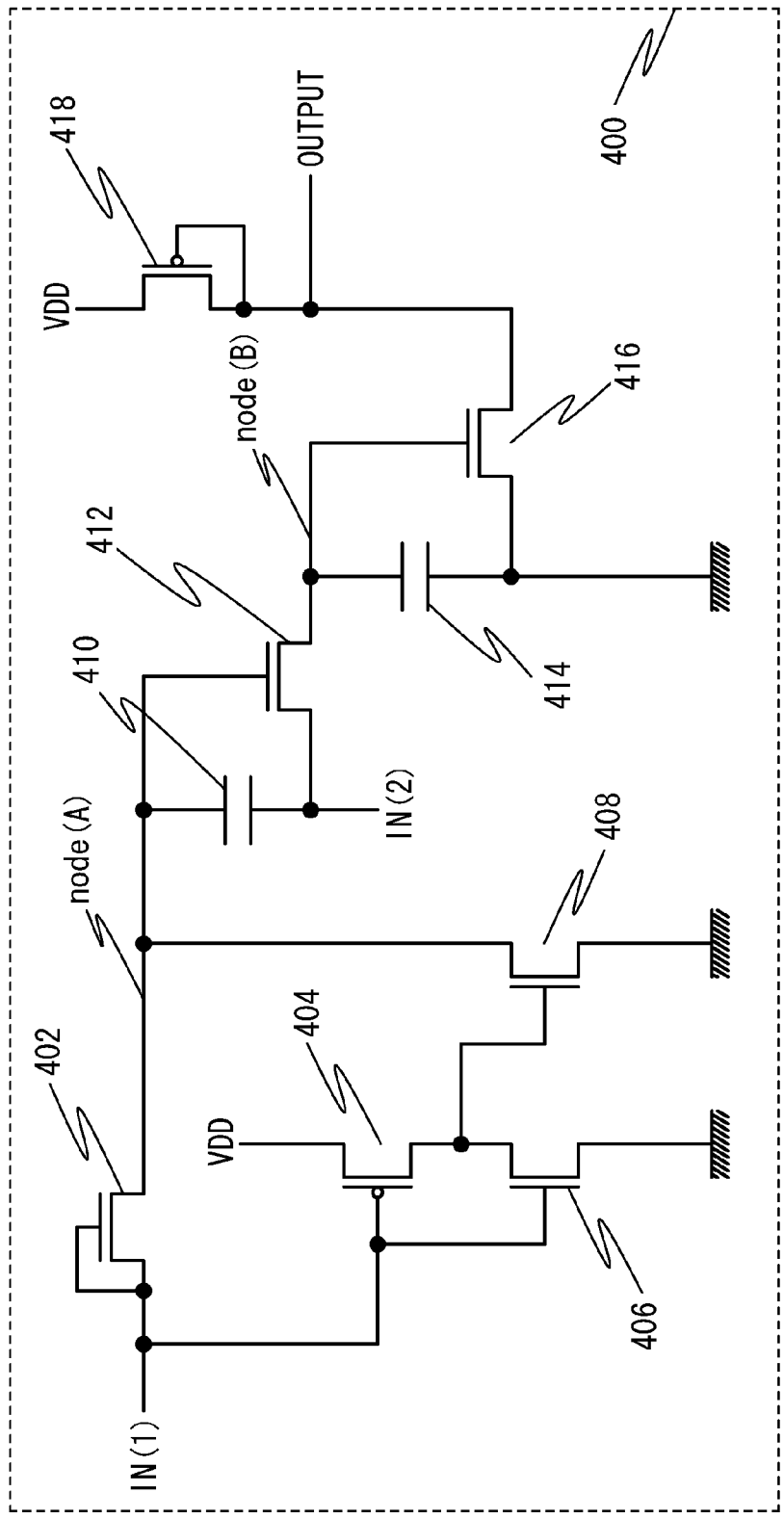
FIG. 10 is a circuit diagram used in Example of the present invention.

First, a circuit used for the calculation will be described with reference to FIG. 10. FIG. 10 illustrates a circuit configuration used in this example.

A circuit 400 includes a transistor 402, a transistor 404, a transistor 406, a transistor 408, a transistor 412, a transistor 416, a transistor 418, a capacitor 410, and a capacitor 414. The circuit 400 also includes two input portions (an input portion IN(1) and an input portion IN(2)), two power input portions (power input portions VDD), three ground potential input portions, and one output portion (an output portion OUTPUT). Here, the transistors 402, 406, 408, 412, and 416 are n-channel transistors. The transistors 404 and 418 are p-channel transistors.

A gate and a first electrode of the transistor 402 are electrically connected to the input portion IN(1). A second electrode of the transistor 402 is electrically connected to a first electrode of the transistor 408, a first electrode of the capacitor 410, and a gate of the transistor 412. A gate of the transistor 404 is electrically connected to the input portion IN(1) and a gate of the transistor 406. A first electrode of the transistor 404 is electrically connected to the power input portion VDD. A second electrode of the transistor 404 is electrically connected to a first electrode of the transistor 406 and a gate of the transistor 408. A second electrode of the transistor 406 is electrically connected to the ground potential input portion. A second electrode of the transistor 408 is electrically connected to the ground potential input portion. A second electrode of the capacitor 410 is electrically connected to the input portion IN(2) and a first electrode of the transistor 412. A second electrode of the transistor 412 is electrically connected to a first electrode of the capacitor 414 and a gate of the transistor 416. A second electrode of the capacitor 414 is electrically connected to a first electrode of the transistor 416 and the ground potential input portion. A second electrode of the transistor 416 is electrically connected to the output portion OUTPUT and a second electrode and a gate of the transistor 418. A first electrode of the transistor 418 is electrically connected to the power input portion VDD.

Here, the transistors 404 and 406 constitute an inverter, and the gate of the transistor 408 is electrically connected to an output portion of the inverter. That is, when a high-level potential is input to IN(1), a low-level potential is input to the gate of the transistor 408, and the transistor 408 is turned off. On the other hand, when a low-level potential is input to IN(1), a high-level potential is input to the gate of the transistor 408, and the transistor 408 is turned on. When the transistor 408 is turned on, electrical continuity is established between a node (A) and the ground potential input portion, so that the node (A) is set at the low-level potential.

In this example, a node electrically connected to the second electrode of the transistor 402, the first electrode of the transistor 408, the first electrode of the capacitor 410, and the gate of the transistor 412 is referred to as the node (A). In addition, a node electrically connected to the second electrode of the transistor 412, the first electrode of the capacitor 414, and the gate of the transistor 416 is referred to as a node (B).
<Input-Output Characteristics>

Next, input-output characteristics calculated using the circuit 400 will be described with reference to FIGS. 11A to 11E. This example calculated changes over time of the potentials of the node (A), the node (B), and the output portion OUTPUT at the time when a voltage is applied to the input portion IN(1) and the input portion IN(2) at different timings and a high-level potential is written into the node (B).

Characteristics of the transistor used for the calculation in this example were characteristics estimated by the measured values of a thin film transistor (with a channel length of 1 μm and a channel width of 20 μm) that was formed using polycrystalline silicon for a semiconductor layer. The threshold voltage of the n-channel transistor was set to 0.42 V and that of the p-channel transistor was set to −0.76 V. The capacitance of the capacitor in the circuit was set to 1.0 pF. The voltage input to the power input portion VDD was 1.7 V. The voltage input to the ground potential input portion was 0 V. A pulse voltage input to the input portion IN(1) and the input portion IN(2) had a high-level potential of 1.7 V and a low-level potential of 0 V.

Figure 11A:
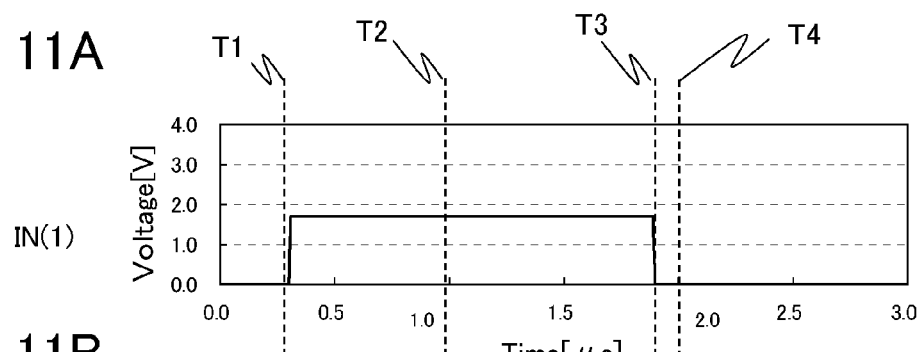
FIGS. 11A to 11E each show input-output characteristics in Example of the present invention.
Figure 11B:
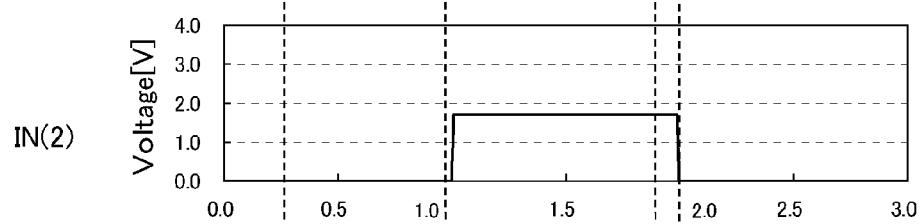
Figure 11C:
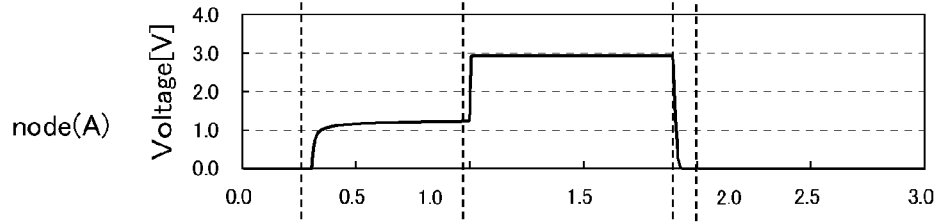
Figure 11D:
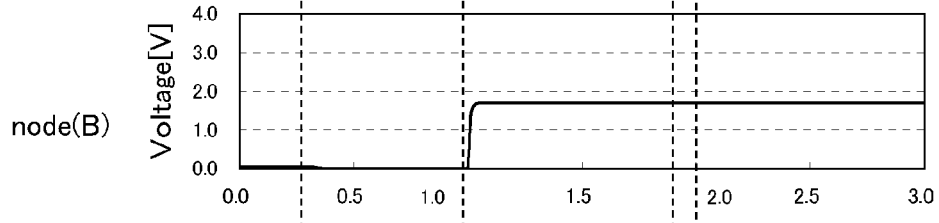
Figure 11E:
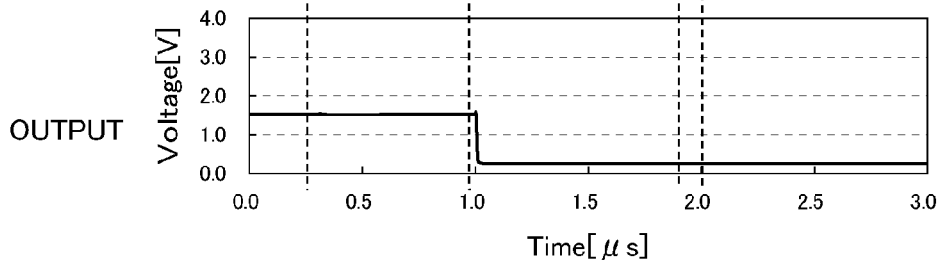

FIG. 11A shows the change over time of the voltage applied to the input portion IN(1). FIG. 11B shows the change over time of the voltage applied to the input portion IN(2). FIGS. 11C, 11D, and 11E respectively show the change over time of the potential of the node (A), the node (B), and the output portion OUTPUT.

Calculation was started, considering the time at which the calculation is started as 0 seconds. First, a voltage of 1.7 V was applied to the input portion IN(1) at about 0.3 μm (T1), and a voltage of 1.7 V was applied to the input portion IN(2) at about 1.0 μm (T2). Then, the voltage of the input portion IN(1) was set at 0 V at about 1.8 μm (T3), and the voltage of the input portion IN(2) was set at 0 V at about 2.0 μm (T4).

When the voltage was applied to the input portion IN(1) at T1, the potential of the node (A) was increased to about 1.2 V. The reason that the voltage of the node (A) did not reach 1.7 V, which was the input voltage, is the influence of the threshold voltage of the transistor 402, the capacitance balance between the node (A) and another wiring (between nodes), and the like.

Next, when the voltage was applied to the input portion IN(2) at T2, the potential of the node (A) was increased to about 2.9 V because of the effect of capacitive coupling of the capacitor 410. At the same time, the potential of the node (B) was increased to 1.7 V, which was the input voltage input to IN(2). Accordingly, the low-level potential was output to the output portion OUTPUT.

When 0 V was input to IN(1) at T3, the potential of the node (A) was decreased to 0 V. In contrast, the potential of the node (B) and the potential of the output portion OUTPUT were not changed and kept the same.

When 0 V was input to IN(2) at T4, the potential of the node (B) and the potential of the output portion OUTPUT were not changed and kept the same.

The above results confirm that a capacitor electrically connected between a word line and a bit line or capacitance between these lines is used and voltage application to the word line is performed prior to voltage application to the bit line in the write operation, so that the potential of the word line can be higher than that of the bit line, and threshold voltage drop at the time of data writing can be suppressed. Therefore, a semiconductor device that does not need to use a power supply voltage set high enough to compensate threshold voltage drop and thus can perform a write operation at low power can be realized according to one embodiment of the present invention.

This application is based on Japanese Patent Application serial No. 2010-170306 filed with Japan Patent Office on Jul. 29, 2010, the entire contents of which are hereby incorporated by reference.

What is claimed is:

1. A semiconductor device comprising:
   a diode;
   a first transistor;
   a second transistor;
   a first capacitor; and
   a functional circuit,
   wherein an output terminal of the diode is electrically connected to a first signal line,
   wherein one of a source and a drain of the first transistor is electrically connected to the first signal line,
   wherein the other of the source and the drain of the first transistor is electrically connected to a reference potential line,
   wherein a gate of the second transistor is electrically connected to the first signal line,
   wherein one of a source and a drain of the second transistor is electrically connected to a second signal line,
   wherein the functional circuit is electrically connected to the other of the source and the drain of the second transistor,
   wherein one of electrodes of the first capacitor is electrically connected to the first signal line, and
   wherein the other of the electrodes of the first capacitor is electrically connected to the second signal line.

2. The semiconductor device according to claim 1,
   wherein the diode is a third transistor,
   wherein a gate of the third transistor is connected to one of a source and a drain of the third transistor, and
   wherein the other of the source and the drain of the third transistor is electrically connected to the first signal line.

3. The semiconductor device according to claim 1, wherein the second transistor is an n-channel transistor.

4. The semiconductor device according to claim 1, wherein a semiconductor layer of the second transistor comprises an oxide semiconductor.

5. The semiconductor device according to claim 1, wherein a current of the second transistor in an off state per 1 μm of channel width is 100 zA or lower with a source-drain voltage of 3.5 V at 25° C.

6. A semiconductor device comprising:
   a diode;
   a first transistor;
   a first capacitor; and
   a memory portion comprising:
      a second transistor; and
      a functional circuit,
   wherein an output terminal of the diode is electrically connected to a first signal line,
   wherein one of a source and a drain of the first transistor is electrically connected to the first signal line,
   wherein the other of the source and the drain of the first transistor is electrically connected to a reference potential line,
   wherein a gate of the second transistor is electrically connected to the first signal line,
   wherein one of a source and a drain of the second transistor is electrically connected to a second signal line,
   wherein the functional circuit is electrically connected to the other of the source and the drain of the second transistor,
   wherein one of electrodes of the first capacitor is electrically connected to the first signal line, and
   wherein the other of the electrodes of the first capacitor is electrically connected to the second signal line.

7. The semiconductor device according to claim 6,
wherein the diode is a third transistor,
wherein a gate of the third transistor is connected to one of a source and a drain of the third transistor, and
wherein the other of the source and the drain of the third transistor is electrically connected to the first signal line.

8. The semiconductor device according to claim 6, wherein the second transistor is an n-channel transistor.

9. The semiconductor device according to claim 6, wherein a semiconductor layer of the second transistor comprises an oxide semiconductor.

10. The semiconductor device according to claim 6, wherein a current of the second transistor in an off state per 1 μm of channel width is 100 zA or lower with a source-drain voltage of 3.5 V at 25° C.

11. A semiconductor device comprising:
a diode;
a first transistor; and
a pixel comprising:
a first capacitor;
a second transistor; and
a functional circuit,
wherein an output terminal of the diode is electrically connected to a first signal line,
wherein one of a source and a drain of the first transistor is electrically connected to the first signal line,
wherein the other of the source and the drain of the first transistor is electrically connected to a reference potential line,
wherein a gate of the second transistor is electrically connected to the first signal line,
wherein one of a source and a drain of the second transistor is electrically connected to a second signal line,
wherein the functional circuit is electrically connected to the other of the source and the drain of the second transistor,
wherein one of electrodes of the first capacitor is electrically connected to the first signal line, and
wherein the other of the electrodes of the first capacitor is electrically connected to the second signal line.

12. The semiconductor device according to claim 11,
wherein the diode is a third transistor,
wherein a gate of the third transistor is connected to one of a source and a drain of the third transistor, and
wherein the other of the source and the drain of the third transistor is electrically connected to the first signal line.

13. The semiconductor device according to claim 11, wherein the second transistor is an n-channel transistor.

14. The semiconductor device according to claim 11, wherein a semiconductor layer of the second transistor comprises an oxide semiconductor.

15. The semiconductor device according to claim 11, wherein a current of the second transistor in an off state per 1 μm of channel width is 100 zA or lower with a source-drain voltage of 3.5 V at 25° C.

16. The semiconductor device according to claim 1, further comprising an inverter,
wherein an input side of the inverter is electrically connected to an input terminal of the diode, and
wherein an output side of the inverter is electrically connected to a gate of the first transistor.

17. The semiconductor device according to claim 1,
wherein the functional circuit comprises a second capacitor and a fourth transistor,
wherein one of a source and a drain of the fourth transistor is electrically connected to a data line,
wherein the other of the source and the drain of the fourth transistor is electrically connected to the reference potential line,
wherein one of electrodes of the second capacitor is electrically connected to the other of the source and the drain of the second transistor and a gate of the fourth transistor, and
wherein the other of the electrodes of the second capacitor is electrically connected to a read signal line.

18. The semiconductor device according to claim 1,
wherein the functional circuit comprises a light emitting element.

19. The semiconductor device according to claim 6,
wherein the functional circuit comprises a second capacitor and a fourth transistor,
wherein one of a source and a drain of the fourth transistor is electrically connected to a data line,
wherein the other of the source and the drain of the fourth transistor is electrically connected to the reference potential line,
wherein one of electrodes of the second capacitor is electrically connected to the other of the source and the drain of the second transistor and a gate of the fourth transistor, and
wherein the other of the electrodes of the second capacitor is electrically connected to a read signal line.

20. The semiconductor device according to claim 6, further comprising an inverter,
wherein an input side of the inverter is electrically connected to an input terminal of the diode, and
wherein an output side of the inverter is electrically connected to a gate of the first transistor.

* * * * *